US012701785B2

(12) United States Patent
Do

(10) Patent No.: US 12,701,785 B2
(45) Date of Patent: Aug. 4, 2026

(54) INTEGRATED CIRCUITS HAVING HETEROGENEOUS DEVICES THEREIN AND METHODS OF DESIGNING THE SAME

(71) Applicant: Samsung Electronics Co., Ltd., Suwon-si (KR)

(72) Inventor: Jungho Do, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 622 days.

(21) Appl. No.: 18/175,765

(22) Filed: Feb. 28, 2023

(65) Prior Publication Data

US 2023/0290779 A1 Sep. 14, 2023

(30) Foreign Application Priority Data

Mar. 10, 2022 (KR) ........................ 10-2022-0030332
Jun. 17, 2022 (KR) ........................ 10-2022-0074340

(51) Int. Cl.
*H10D 84/85* (2025.01)
*H10D 30/62* (2025.01)
*H10D 30/67* (2025.01)
*H10D 62/10* (2025.01)
*H10W 20/20* (2026.01)

(52) U.S. Cl.
CPC ....... *H10D 84/853* (2025.01); *H10D 30/6211* (2025.01); *H10D 30/6735* (2025.01); *H10D 62/121* (2025.01); *H10W 20/20* (2026.01)

(58) Field of Classification Search
CPC ............. H10D 84/853; H10D 30/6211; H10D 30/6735; H10D 62/121; H10D 30/6757;
H10D 84/834; H10D 89/10; H10D 84/0149; H10D 84/016; H10D 84/0186; H10D 84/0195; H10D 84/038; H10D 84/83; H10D 84/85; H01L 23/481; H01L 21/76895; H01L 23/5286; H01L 23/535
See application file for complete search history.

(56) References Cited

U.S. PATENT DOCUMENTS

| | | |
|---|---|---|
| 9,483,600 B2 | 11/2016 | Bansal et al. |
| 9,960,155 B2 | 5/2018 | Anderson et al. |
| 10,985,272 B2 | 4/2021 | Do |
| | (Continued) | |

FOREIGN PATENT DOCUMENTS

| | | |
|---|---|---|
| KR | 10-2009-0041755 A | 4/2009 |
| KR | 10-2012-0139067 A | 12/2012 |
| KR | 10-2020-0050329 A | 5/2020 |

*Primary Examiner* — Britt Hanley
*Assistant Examiner* — William C. Trice, III
(74) *Attorney, Agent, or Firm* — Wolf, Greenfield & Sacks, P.C.

(57) ABSTRACT

An integrated circuit includes: (i) a first transistor having a first gate extending in a first direction, a first drain, and a first source that is separated from the first drain in a second direction, which is perpendicular to the first direction, (ii) a second transistor having a second gate extending in one of the first and second directions, a second drain, and a second source that is separated from the second drain in a third direction, which is perpendicular to the first and second directions, and (iii) a first connection structure that electrically connects the first transistor to the second transistor, and includes a pattern extending in the first direction between the first transistor and the second transistor.

20 Claims, 31 Drawing Sheets

(56)                    References Cited

U.S. PATENT DOCUMENTS

| | | |
|---|---|---|
| 11,031,397 B2 | 6/2021 | Liaw |
| 11,081,400 B2 | 8/2021 | Cheng et al. |
| 11,201,093 B2 | 12/2021 | Veloso et al. |
| 2012/0319201 A1* | 12/2012 | Sun ........................ H10B 10/12 |
| | | 257/338 |
| 2018/0292989 A1* | 10/2018 | Lee ........................ G06F 3/0659 |
| 2019/0341489 A1 | 11/2019 | Chi et al. |
| 2020/0303460 A1* | 9/2020 | Yao ...................... H10D 30/027 |
| 2022/0181258 A1* | 6/2022 | Liebmann .............. H10D 30/67 |

* cited by examiner

10c

CH

T_S/D

G

B_S/D

Z

Y

X

| | | | |
|---|---|---|---|
| ⊞ : PFET Region | ▦ : BPR | ≋ : Contact |
| ⊟ : NFET Region | ⧄ : S/D | ⧅ : Gate |

| | | | | |
|---|---|---|---|---|
| ▒ : BILD | ▥ : PFET Region | ◩ : Gate | ▨ : S/D |
| ▦ : BSPR | ▤ : NFET Region | ▥ : Contact | |

| : BILD | : PFET Region | : Gate | : S/D |
|---|---|---|---|
| : BSPR | : NFET Region | : Contact | |

| | | | |
|---|---|---|---|
| : BILD | : PFET Region | : Gate | : S/D |
| : BSPR | : NFET Region | : Contact | |

INTEGRATED CIRCUITS HAVING HETEROGENEOUS DEVICES THEREIN AND METHODS OF DESIGNING THE SAME

REFERENCE TO PRIORITY APPLICATIONS

This application claims priority under 35 U.S.C. § 119 to Korean Patent Application Nos.: 10-2022-0030332, filed Mar. 10, 2022, and 10-2022-0074340, filed Jun. 17, 2022, the disclosures of which are hereby incorporated herein by reference in their entireties.

BACKGROUND

The inventive concept relates to integrated circuits (IC), and more particularly, to integrated circuits having heterogeneous devices therein and methods of designing the same.

With the advancement of semiconductor processes, devices having various shapes and structures have been developed. Each of the devices may also have unique characteristics. ICs may have various requirements for layout area, performance, heat generation, and the like. To satisfy various requirements, it may be necessary to design an IC including multiple devices having different optimized characteristics and layouts.

SUMMARY

The inventive concept provides an integrated circuit having heterogeneous devices therein that are electrically coupled together, and methods of designing the integrated circuit.

According to an aspect of the inventive concept, an integrated circuit is provided, which includes a first transistor having a first gate extending in a first direction, a first drain, and a first source that is separated from the first drain in a second direction, which is perpendicular to the first direction. A second transistor is provided that has a second gate extending in one of the first and second directions, a second drain, and a second source that is from the second drain in a third direction that is perpendicular to the first and second directions. A first connection structure is provided, which includes a pattern extending in the first direction and between the first transistor and the second transistor. This first connection structure electrically connects the first transistor to the second transistor.

According to another aspect of the inventive concept, an integrated circuit is provided that includes a first transistor, a second transistor, and a first connection structure. The first transistor includes a first gate extending in a first direction, a first drain, and a first source that is separated from the first drain in a second direction, which is perpendicular to the first direction. The second transistor includes a second gate extending in one of the first and second directions, a second drain, and a second source that is separated from the second drain in a third direction, which is perpendicular to the first and second directions. The first connection structure includes a first pattern extending in the third direction, between the first transistor and the second transistor. The first connection structure electrically connects the first transistor to the second transistor.

According to a further aspect of the inventive concept, an integrated circuit is provided that includes a first transistor having a first gate extending in a first direction, a first drain, and a first source that is separated from the first drain in a second direction, which is perpendicular to the first direction. A second transistor is provided that includes a second gate extending in one of the first and second directions, a second drain, and a second source that is separated from the second drain in a third direction perpendicular to the first and second directions. A first connection structure is provided, which electrically connects the first transistor to the second transistor.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Figure 1A:
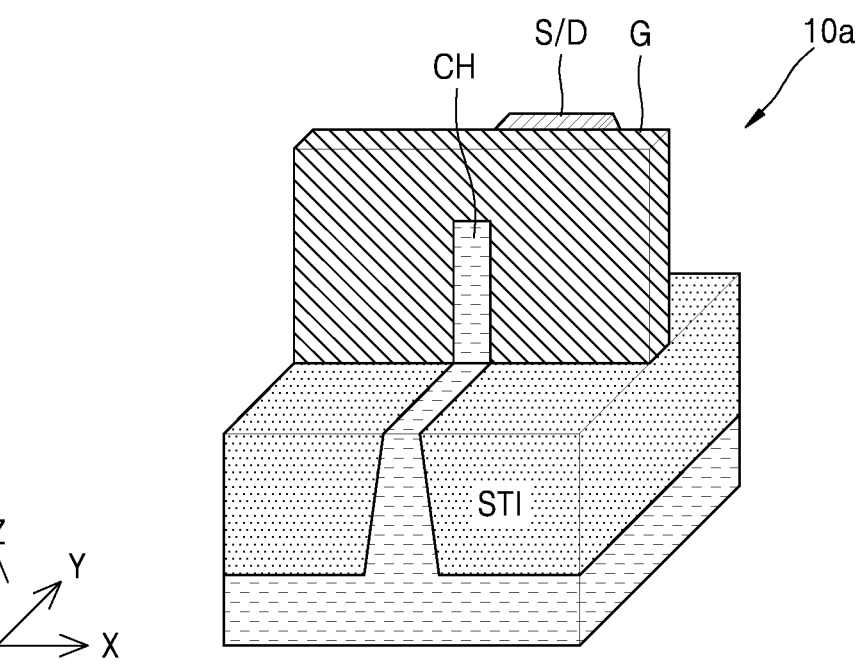
FIGS. 1A to 1C are diagrams of devices according to example embodiments.
Figure 1B:
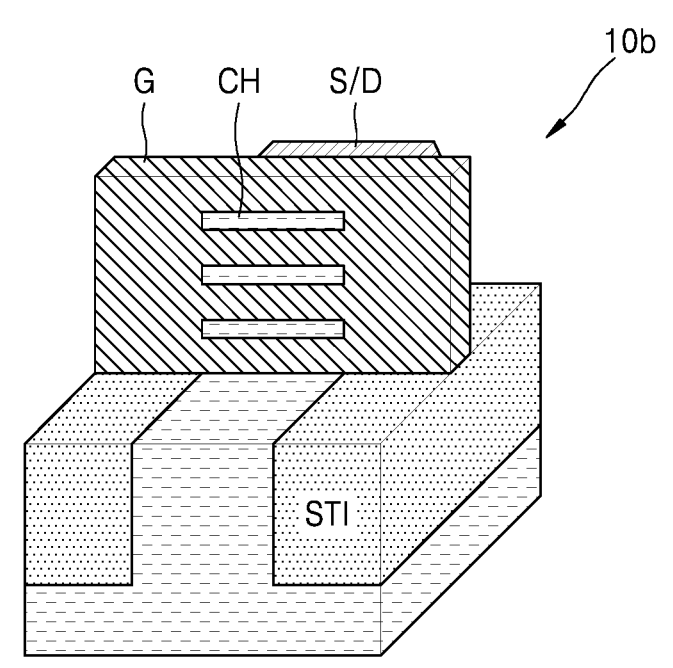
Figure 1B:
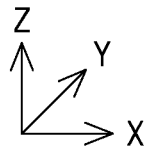
Figure 1C:
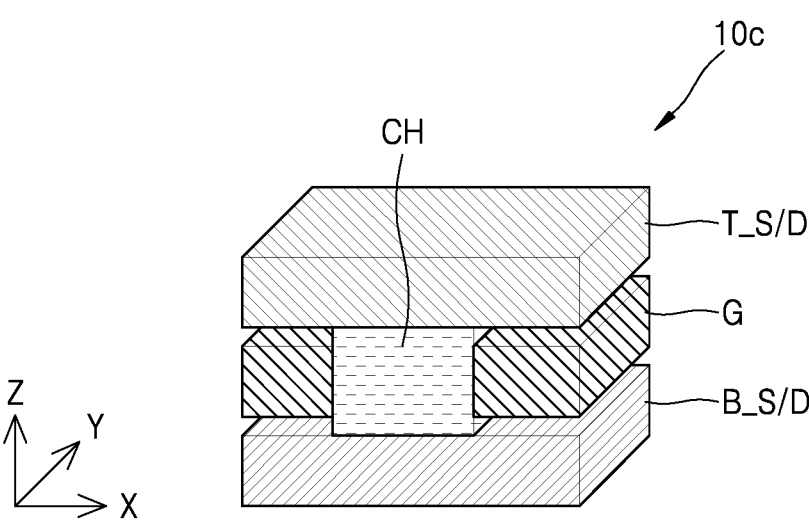

FIGS. 1A to 1C are diagrams of examples of devices according to example embodiments. In detail, FIG. 1A illustrates a fin field-effect transistor (FinFET) 10a, FIG. 1B illustrates a gate-all-around FET (GAAFET) 10b, and FIG. 1C illustrates a vertical FET (VFET) 10c. For convenience of illustration, FIGS. 1A and 1B respectively illustrate the FinFET 10a and the GAAFET 10b, from each of which one of two source/drain regions is removed for clarity, and FIG. 1C illustrates a cross-section of the VFET 10c, taken along a plane that is parallel with a plane defined by an X-axis and a Z-axis and passes through a channel CH of the VFET 10c.

Herein, an X-axis direction and a Y-axis direction may be respectively referred to as a first direction and a second direction, and a Z-axis direction may be referred to as a vertical direction or a third direction. A plane defined by the X-axis and a Y-axis may be referred to as a horizontal plane. An element positioned in a +Z direction compared to another element may be considered as being above the other element. An element positioned in a −Z direction compared to another element may be considered as being below the other element. The area of an element may refer to a size occupied by the element in a plane parallel with the horizontal plane, and the width of the element may refer to a length of the element in a direction perpendicular to a direction in which the element extends. In the accompanying drawings, only some layers may be illustrated for convenience of illustration, and even though a via is below a pattern of a wiring layer, the via may be illustrated to show the connection between the pattern of the wiring layer and a lower pattern. A pattern (e.g., a pattern of a wiring layer), which includes a conductive material, may be referred to as a conductive pattern or simply a pattern.

An integrated circuit (IC) may be fabricated by semiconductor processes and may include a plurality of devices. For example, an IC may include an active device, such as a transistor, and a passive device, such as a capacitor. Semiconductor processes may include a series of subprocesses of forming a transistor in a predefined structure. For example, the FinFET 10$a$, the GAAFET 10$b$, and the VFET 10$c$ may be formed by semiconductor processes. In some embodiments, semiconductor processes may include subprocesses of forming a transistor in a different structure than the FinFET 10$a$, the GAAFET 10$b$, and the VFET 10$c$. For example, a ForkFET having a structure, in which an N-type transistor is close to a P-type transistor, by separating nanosheets for the P-type transistor from nanosheets for the N-type transistor with a dielectric wall, may be formed by semiconductor processes. A complementary FET (CFET), a negative CFET (NCFET), a carbon nanotube (CNT) FET, and a bipolar junction transistor may also be formed by semiconductor processes.

Referring to FIG. 1A, the FinFET 10$a$ may be formed by an active pattern, which has a fin shape and extends in the Y-axis direction between shallow trench isolations (STIs), and a gate G extending in the X-axis direction. A source/drain S/D may be formed at each of opposite sides of the gate G, and accordingly, a source may be separated from a drain in the Y-axis direction. An insulating film (not shown) may be formed between the channel CH and the gate G.

Referring to FIG. 1B, the GAAFET 10$b$ may be formed by a plurality of active patterns (or nanowires), which are separated from each other in the Z-axis direction and extend in the Y-axis direction, and the gate G extending in the X-axis direction. The source/drain S/D may be formed at each of the opposite sides of the gate G, and accordingly, a source may be separated from a drain in the Y-axis direction. An insulating film may be formed between the channel CH and the gate G.

A structure, in which a plurality of nanosheets cross the gates G as shown in FIG. 1B, may be referred to as a multi-bridge channel FET (MBCFET). The number of nanosheets included in the GAAFET 10$b$ is not limited to the embodiment of FIG. 1B. Herein, transistors, which include a source and a drain that are separated from each other in a direction (i.e., the X-axis direction or the Y-axis direction) perpendicular to a layer stacking direction (i.e., the Z-axis direction), like the FinFET 10$a$ of FIG. 1A and the GAAFET 10$b$ of FIG. 1B, may be referred to as lateral transistors. Among lateral transistors, an FET may be referred to as a lateral FET (LFET). Hereinafter, a GAAFET is mainly described as an example of an LFET, but embodiments are not limited thereto.

Referring to FIG. 1C, the VFET 10$c$ may include a top source/drain T_S/D and a bottom source/drain B_S/D, which are separated from each other by the channel CH in the Z-axis direction. The VFET 10$c$ may include the gate G, which is between the top source/drain T_S/D and the bottom source/drain B_S/D and surrounds the channel CH. An insulating film (not shown) may be formed between the channel CH and the gate G.

As described below with reference to FIGS. 2A to 3B, a transistor may have unique characteristics due to the structure thereof. For example, an LFET may provide better performance than the VFET 10$c$ due to a wide effective channel width while the VFET 10$c$ may provide higher integration density than an LFET due to a source and a drain that are separated from each other in the stacking direction (i.e., the Z-axis direction). As described below with reference to the drawings, an IC may include transistors having different structures and thus be designed to satisfy various requirements for an area, a speed, power, heat generation, and the like. Therefore, an IC may include a structure (which may be herein referred to as a connection structure) for electrically connecting transistors, which respectively have different structures, to each other.

Figure 2A:
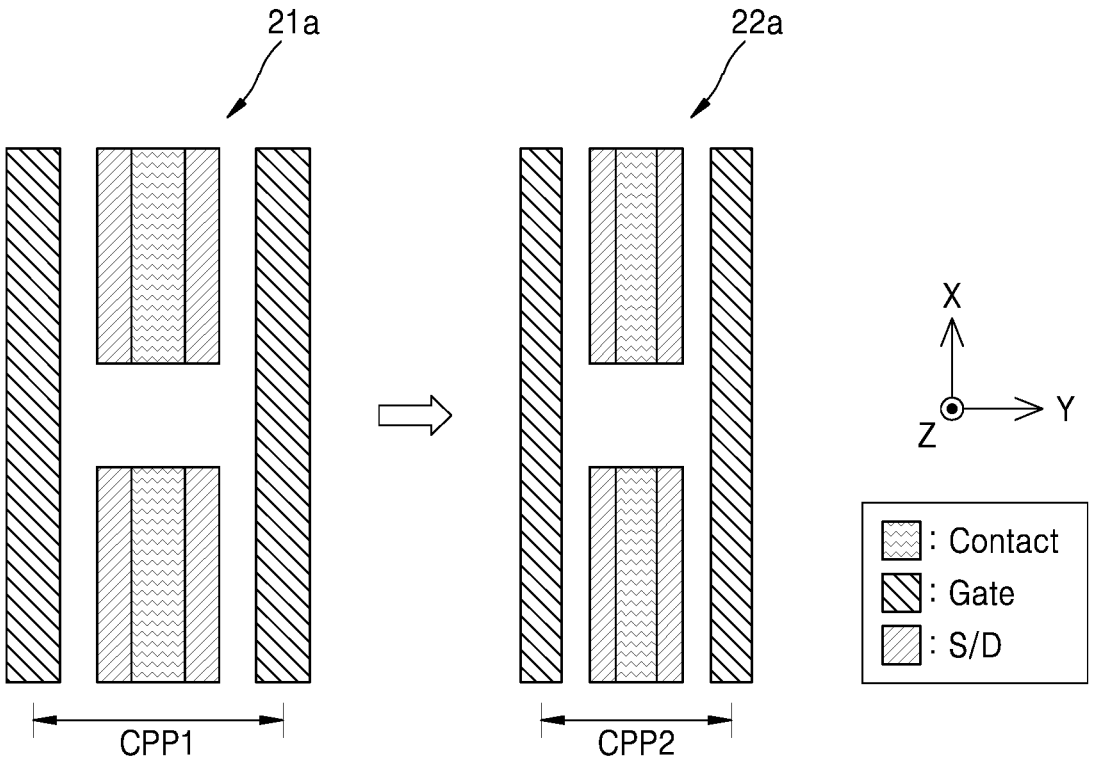
FIGS. 2A and 2B are respectively plan views of the layouts of integrated circuits (ICs) according to example embodiments.
Figure 2B:
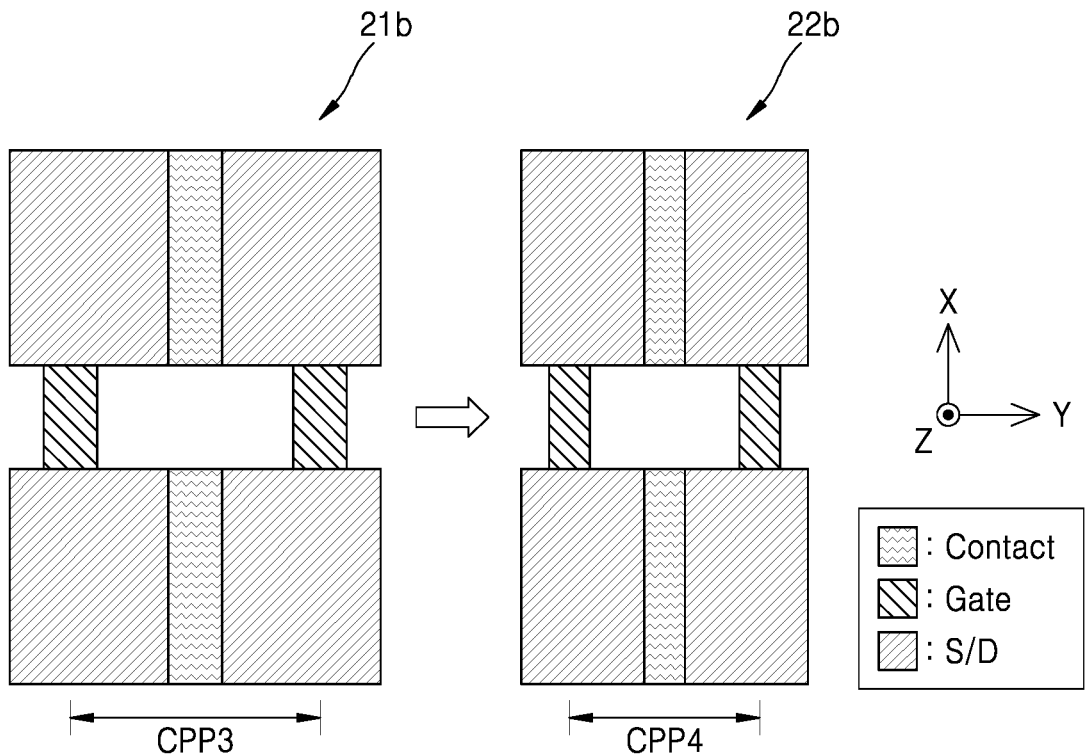

FIGS. 2A and 2B are respectively plan views of the layouts of ICs according to example embodiments. In detail, the plan view of FIG. 2A shows a first layout 21$a$ and a second layout 22$a$ of an IC including an LFET, and the plan view of FIG. 2B shows a first layout 21$b$ and a second layout 22$b$ of an IC including a VFET. Referring to FIG. 2A, gates in the first layout 21$a$ may have a first contacted poly pitch CPP1. As shown in FIG. 2A, a source/drain may be formed between gates extending in the X-axis direction, and a contact may be formed on the source/drain. For high integration density, gates in the second layout 22$a$ may have a second contacted poly pitch CPP2 that is less than the first contacted poly pitch CPP1 (i.e., CPP2<CPP1). For the second layout 22$a$, the widths (i.e., the lengths in the Y-axis direction) of the gates, the source/drain, and the contact may need to be reduced, and accordingly, issues to be overcome in semiconductor processes may increase.

Referring to FIG. 2B, gates in the first layout 21$b$ may have a third contacted poly pitch CPP3. As shown in FIG. 2B, a top source/drain may be formed above the gates, and a contact may be formed on the top source/drain. In some embodiments, as described below with reference to FIG. 6A and so on, VFETs may be more densely formed by semiconductor processes than LFETs, and accordingly, the third contacted poly pitch CPP3 may be less than the first contacted poly pitch CPP1 (i.e., CPP3<CPP1). For high integration density, gates in the second layout 22$b$ may have a fourth contacted poly pitch CPP4 that is less than the third contacted poly pitch CPP3 (i.e., CPP4<CPP3). For the second layout 22$b$, the width (i.e., the lengths in the Y-axis direction) of only the gates may need to be reduced. Accordingly, issues to be overcome in semiconductor processes may decrease. Consequently, VFETs may more easily provide a high integration density than LFETs in an IC.

Figure 3A:
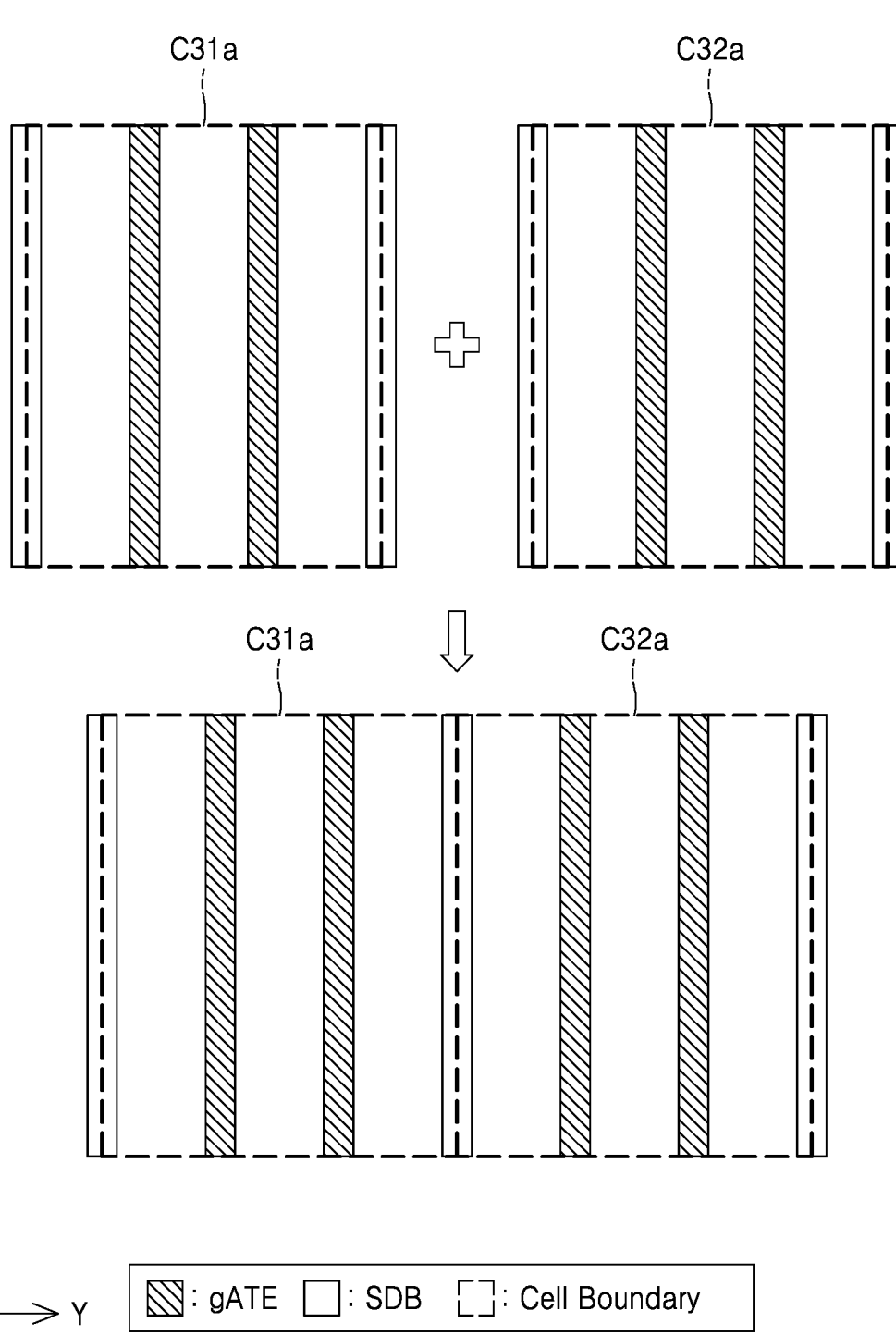
FIGS. 3A and 3B are respectively plan views of the layouts of ICs according to example embodiments.
Figure 3B:
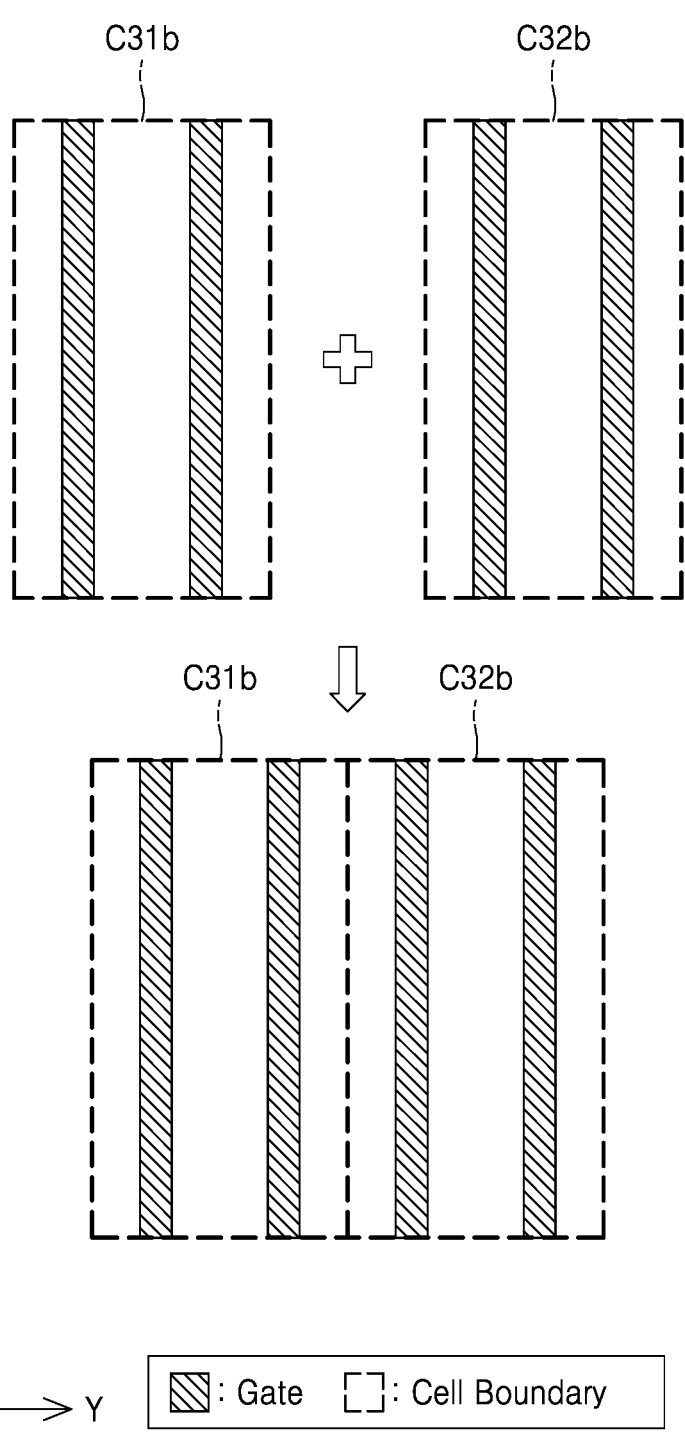

FIGS. 3A and 3B are respectively plan views of the layouts of ICs according to example embodiments. In detail, the plan view of FIG. 3A shows gates in the layout of an IC including an LFET, and plan view of FIG. 3B shows gates in the layout of an IC including a VFET. An IC may include a plurality of standard cells. A standard cell may be a unit of a layout included in an IC and simply referred to as a cell. A cell may include a transistor and may be designed to perform a predefined function. For example, a first cell C31$a$ and a second cell C32$a$ in FIG. 3A may have the same height (i.e., length in the X-axis direction) and, as shown in the lower part of FIG. 3A, may be adjacent to each other in a row extending in the Y-axis direction. Similarly, a first cell C31*b* and a second cell C32*b* in FIG. 3B may have the same height (i.e., length in the X-axis direction) and, as shown in the lower part of FIG. 3B, may be adjacent to each other in a row extending in the Y-axis direction. A standard cell in one row may be referred to as a single-height cell, and a cell continuously arranged across at least two rows like a standard cell C52 in FIG. 5A may be referred to as a multi-height cell.

Referring to FIG. 3A, a cell including an LFET may be terminated by a diffusion break. The diffusion break may block interference between devices respectively included in adjacent cells. For example, as shown in FIG. 3A, diffusion breaks instead of gates may be respectively formed at boundaries of the first and second cells C31*a* and C32*a*, wherein the boundaries of the first and second cells C31*a* and C32*a* are parallel with the X-axis. The first and second cells C31*a* and C32*a* adjacent to each other may share the diffusion break with each other. As shown in FIG. 3A, a diffusion break in a gate position may be referred to as a single diffusion break (SDB) or a dummy gate. In some embodiments, unlike FIG. 3A, a cell may have boundaries extending in the X-axis direction between gate electrodes, and a diffusion break between respective gates of adjacent cells may be referred to as a double diffusion break (DDB).

Referring to FIG. 3B, a diffusion break may be omitted from a cell including a VFET and referred to as a zero diffusion break (ZDB). Accordingly, as shown in FIG. 3B, gates in the first and second cells C31*b* and C32*b* adjacent to each other may be separated from each other by the same contacted poly pitch. Consequently, a VFET may be more advantageous for high integration density than an LFET. As described above with reference to FIGS. 1A to 1C, an LFET may provide higher performance than a VFET, and accordingly, an IC including both LFETs and VFETs may be designed to have optimal performance and area by utilizing the best of both device technologies.

FIGS. 4A to 4D are respectively cross-sectional views of examples of ICs according to example embodiments. In detail, the cross-sectional views of FIGS. 4A to 4D show examples of an LFET and a VFET, which are electrically connected to each other. As described above with reference to FIGS. 1A to 1C, an IC may include heterogeneous devices and connection structures connecting the heterogeneous devices to each other. In FIGS. 4A to 4D, an LFET and a VFET may be separated from each other in the Y-axis direction, and a connection structure may include a pattern extending the Y-axis direction. In some embodiments, as described below with reference to FIG. 6A and so on, an LFET and a VFET may be separated from each other in the X-axis direction, and a connection structure may include a pattern extending in the X-axis direction. Although it is illustrated in FIGS. 4A to 4D that a source/drain of an LFET is electrically connected to a source/drain of a VFET, it would be understood that a gate of each of the LFET and the VFET is connected to a gate or a source/drain of another transistor in a similar manner to the examples. Redundant descriptions of FIGS. 4A to 4D are omitted from the descriptions thereof below.

Figure 4A:
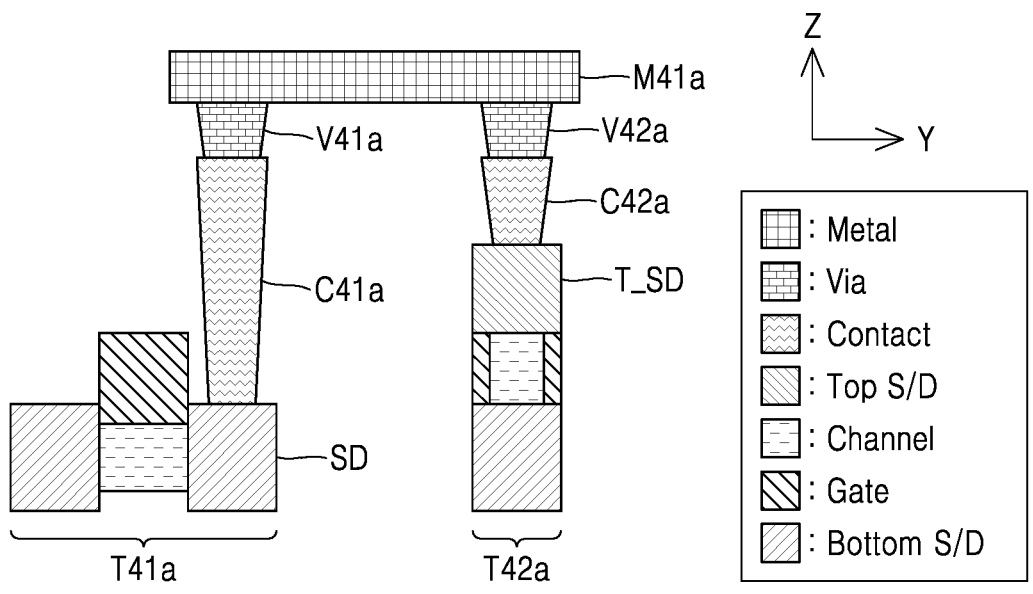
FIGS. 4A to 4D are respectively cross-sectional views of examples of ICs according to example embodiments.

Referring to FIG. 4A, in some embodiments, an LFET T41*a* may be electrically connected to a VFET T42*a* through a metal pattern extending in the Y-axis direction. For example, as shown in FIG. 4A, a source/drain SD of the LFET T41*a* may be electrically connected to a first metal pattern M41*a* through a first contact C41*a* and a first via V41*a*. A top source/drain T_SD of the VFET T42*a* may be electrically connected to the first metal pattern M41*a* through a second contact C42*a* and a second via V42*a*. The first metal pattern M41*a* may extend in the Y-axis direction, may be connected to the first via V41*a* and the second via V42*a*, and may thereby electrically connect the source/drain SD of the LFET T41*a* to the top source/drain T_SD of the VFET T42*a*, as shown.

Figure 4B:
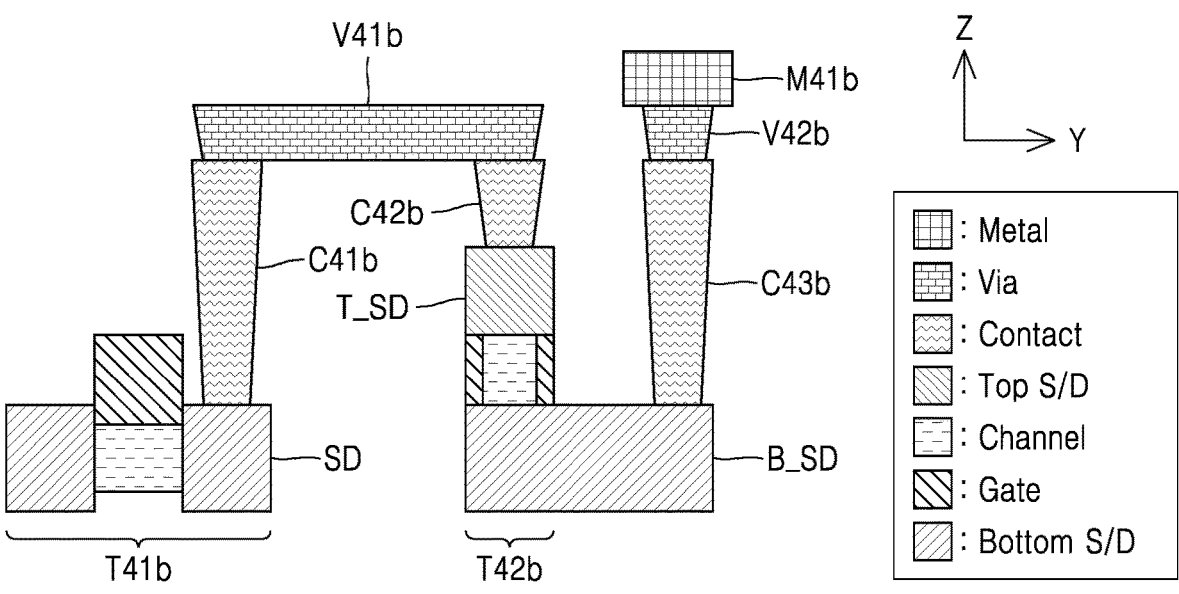

Referring to FIG. 4B, in some embodiments, an LFET T41*b* may be electrically connected to a VFET T42*b* through a via extending in the Y-axis direction. For example, as shown in FIG. 4B, a source/drain SD of the LFET T41*b* may be electrically connected to a first via V41*b* through a first contact C41*b*. A top source/drain T_SD of the VFET T42*b* may be electrically connected to the first via V41*b* through a second contact C42*b*. The first via V41*b* may extend in the Y-axis direction, may be connected to the first contact C41*b* and the second contact C42*b*, and may electrically connect the source/drain SD of the LFET T41*b* to the top source/drain T_SD of the VFET T42*b*. As shown in FIG. 4B, a bottom source/drain B_SD of the VFET T42*b* may extend in the Y-axis direction and may be electrically connected to a first metal pattern M41*b* through a third contact C43*b* and a second via V42*b*.

Figure 4C:
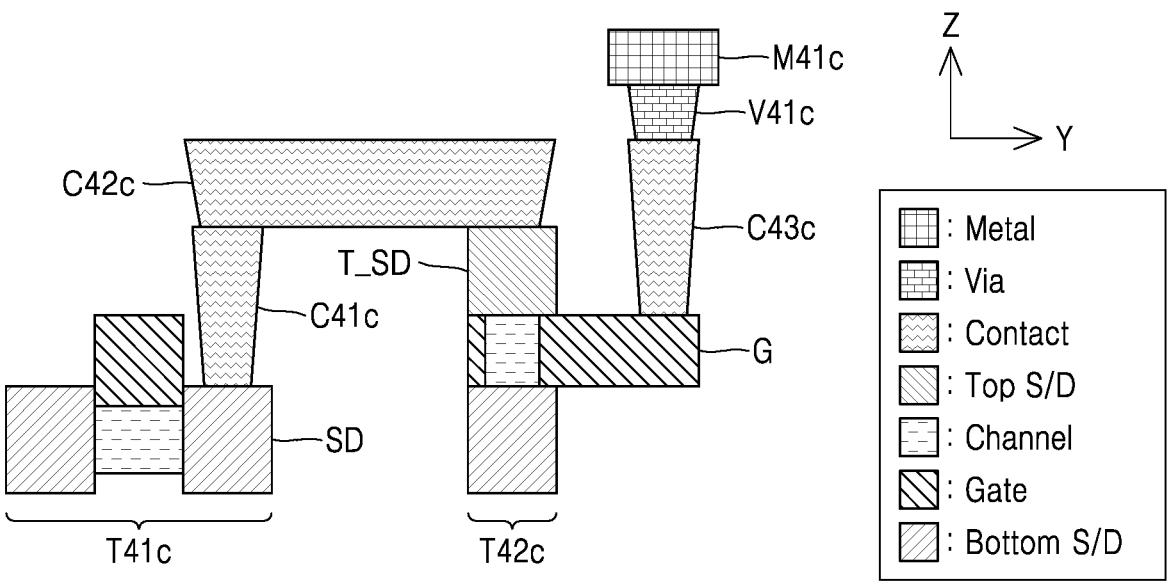

Referring to FIG. 4C, in some additional embodiments, an LFET T41*c* may be electrically connected to a VFET T42*c* through a contact extending in the Y-axis direction. For example, as shown in FIG. 4C, a source/drain SD of the LFET T41*c* may be electrically connected to a second contact C42*c* through a first contact C41*c*. A top source/drain TSD of the VFET T42*c* may be connected to the second contact C42*c*. The second contact C42*c* may extend in the Y-axis direction, may be connected to the first contact C41*c* and the top source/drain TSD of the VFET T42*c*, and may electrically connect the source/drain SD of the LFET T41*c* to the top source/drain T_SD of the VFET T42*c*. As shown in FIG. 4C, a gate G of the VFET T42*c* may extend in the Y-axis direction and may be electrically connected to a first metal pattern M41*c* through a third contact C43*c* and a first via V41*c*.

Figure 4D:
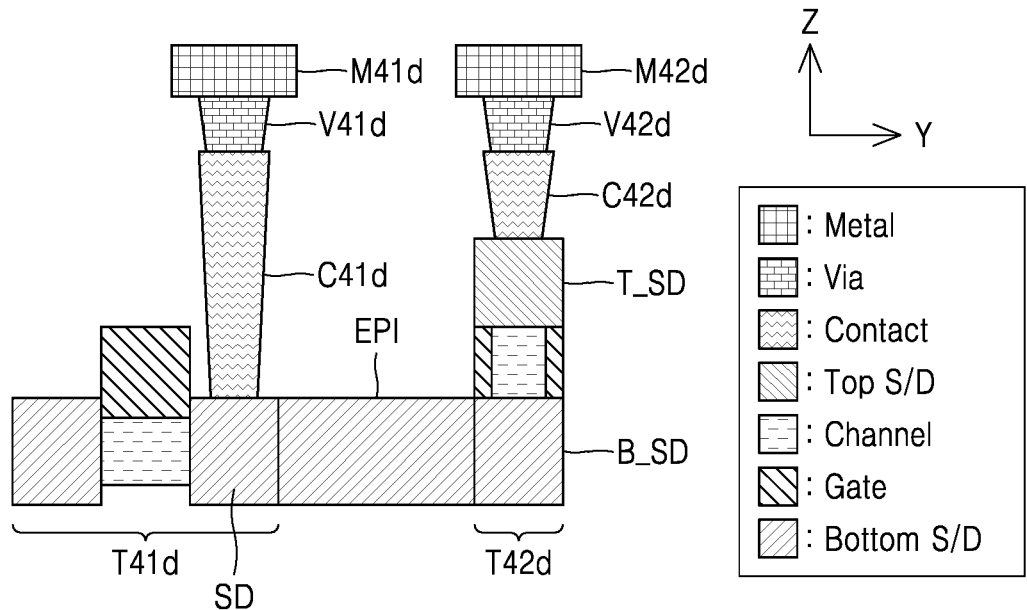

Referring to FIG. 4D, in some embodiments, an LFET T41*d* may be electrically connected to a VFET T42*d* through a source/drain extending in the Y-axis direction. For example, as shown in FIG. 4D, a source/drain SD of the LFET T41*d* may be electrically connected to a bottom source/drain B_SD of the VFET T42*d* through a diffusion region EPI extending in the Y-axis direction. The source/drain SD of the LFET T41*d* may be electrically connected to a first metal pattern M41*d* through a first contact C41*d* and a first via V41*d*. A top source/drain TSD of the VFET T42*d* may be electrically connected to a second metal pattern M42*d* through a second contact C42*d* and a second via V42*d*.

Figure 5A:
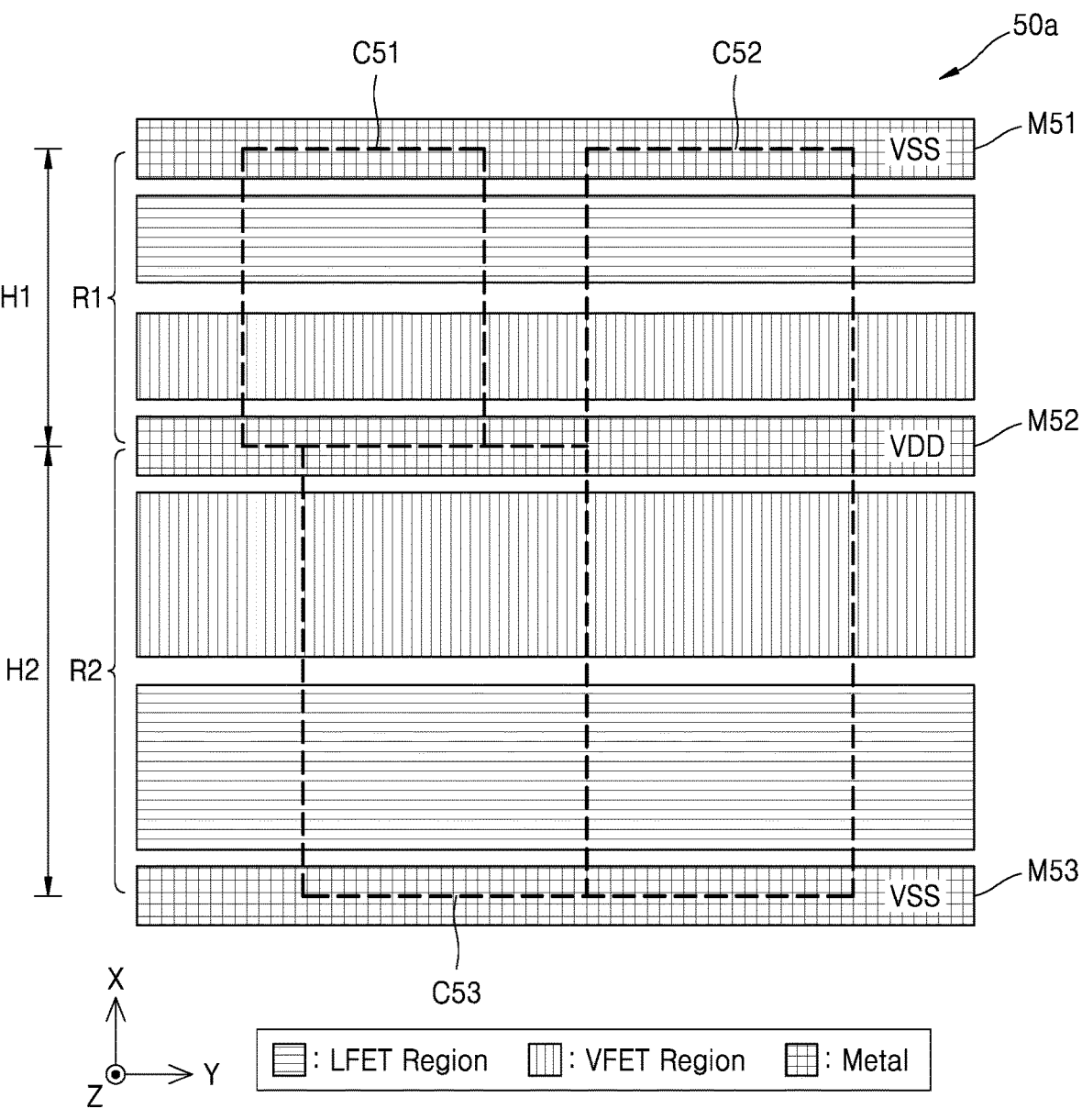
FIGS. 5A and 5B are respectively plan views of the layouts of ICs according to example embodiments.
Figure 5B:
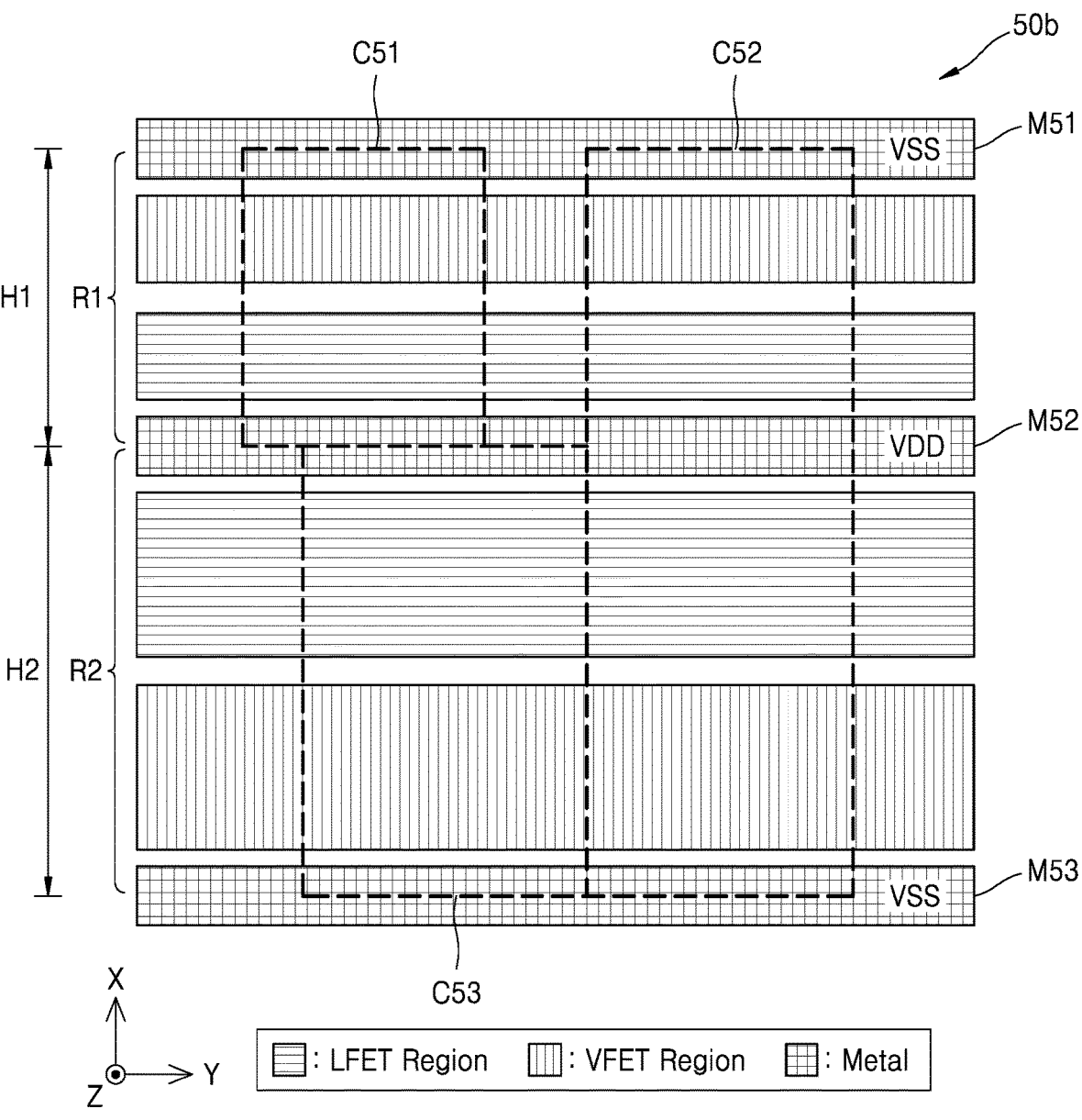

FIGS. 5A and 5B are respectively plan views of the layouts of ICs according to example embodiments. In some embodiments, a cell included in an IC 50*a* or 50*b* may include at least one LFET, at least one VFET, and a pattern electrically connecting the LFET to the VFET.

Referring to FIGS. 5A and 5B, a first row R1 and a second row R2 may extend in the Y-axis direction, and cells may be arranged in the first and second rows R1 and R2 to be aligned with each other. For example, a first cell C51 may be in the first row R1, a second cell C52 may continue across the first and second rows R1 and R2, and a third cell C53 may be in the second row R2. Power rails, which supply power to cells, may be respectively at boundaries of the first and second rows R1 and R2 and extend in the Y-axis direction. For example, first and third metal patterns M51 and M53, to which a negative supply voltage VSS (or ground voltage) is applied, and a second metal pattern M52, to which a positive supply voltage VDD is applied, may extend in the Y-axis direction.

Each of the first to third cells C51, C52, and C53 may include at least one LFET and at least one VFET. For example, as shown in FIGS. 5A and 5B, an LFET region and a VFET region may extend in the Y-axis direction in the first row R1, and each of the first and second cells C51 and C52 may include at least one LFET in the LFET region and at least one VFET in the VFET region. An LFET region and a VFET region may extend in the Y-axis direction in the second row R2, and each of the second and third cells C52 and C53 may include at least one LFET in the LFET region and at least one VFET in the VFET region.

In some embodiments, a first width H1 of the first row R1 may be the same as or different from a second width H2 of the second row R2. For example, as shown in FIGS. 5A and 5B, the second width H2 of the second row R2 may be greater than the first width H1 of the first row R1 (i.e., H2>H1). Accordingly, an LFET (or a VFET) in the second row R2 may have higher current driving strength than an LFET (or a VFET) in the first row R2 and may provide a high operating speed.

As shown in FIG. 5A, each LFET region may be adjacent to a power rail, to which the negative supply voltage VSS is applied, and an n-channel FET (NFET) may be formed in the LFET region. Each VFET region may be adjacent to a power rail, to which the positive supply voltage VDD is applied, and a p-channel FET (PFET) may be formed in the VFET region. Referring to FIG. 5B, each LFET region may be adjacent to a power rail, to which the positive supply voltage VDD is applied, and a PFET may be formed in the LFET region. Each VFET region may be adjacent to a power rail, to which the negative supply voltage VSS is applied, and an NFET may be formed in the VFET region.

Figure 6A:
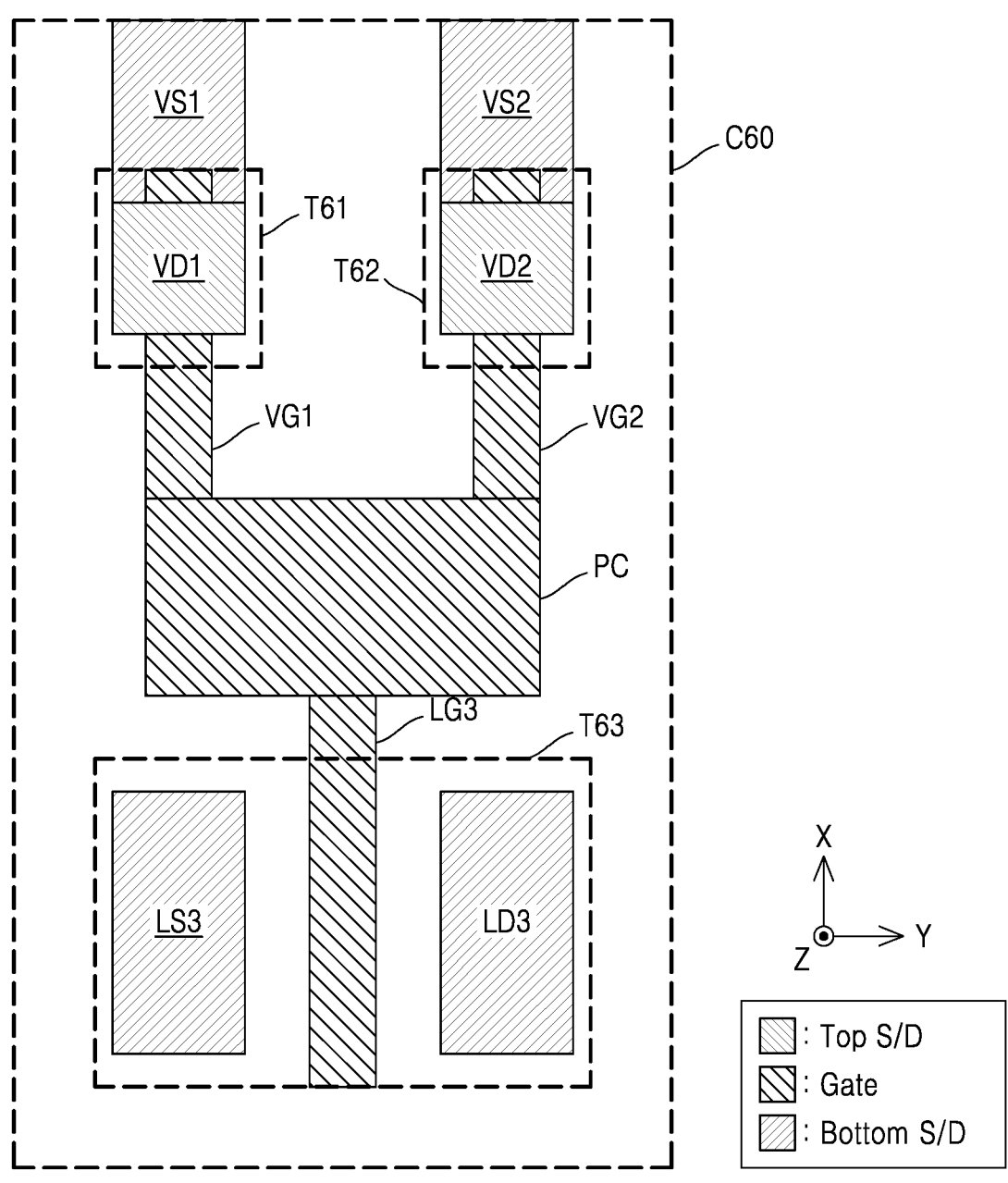
FIGS. 6A and 6B are respectively plan views of the layouts of a cell according to an example embodiment.
Figure 6B:
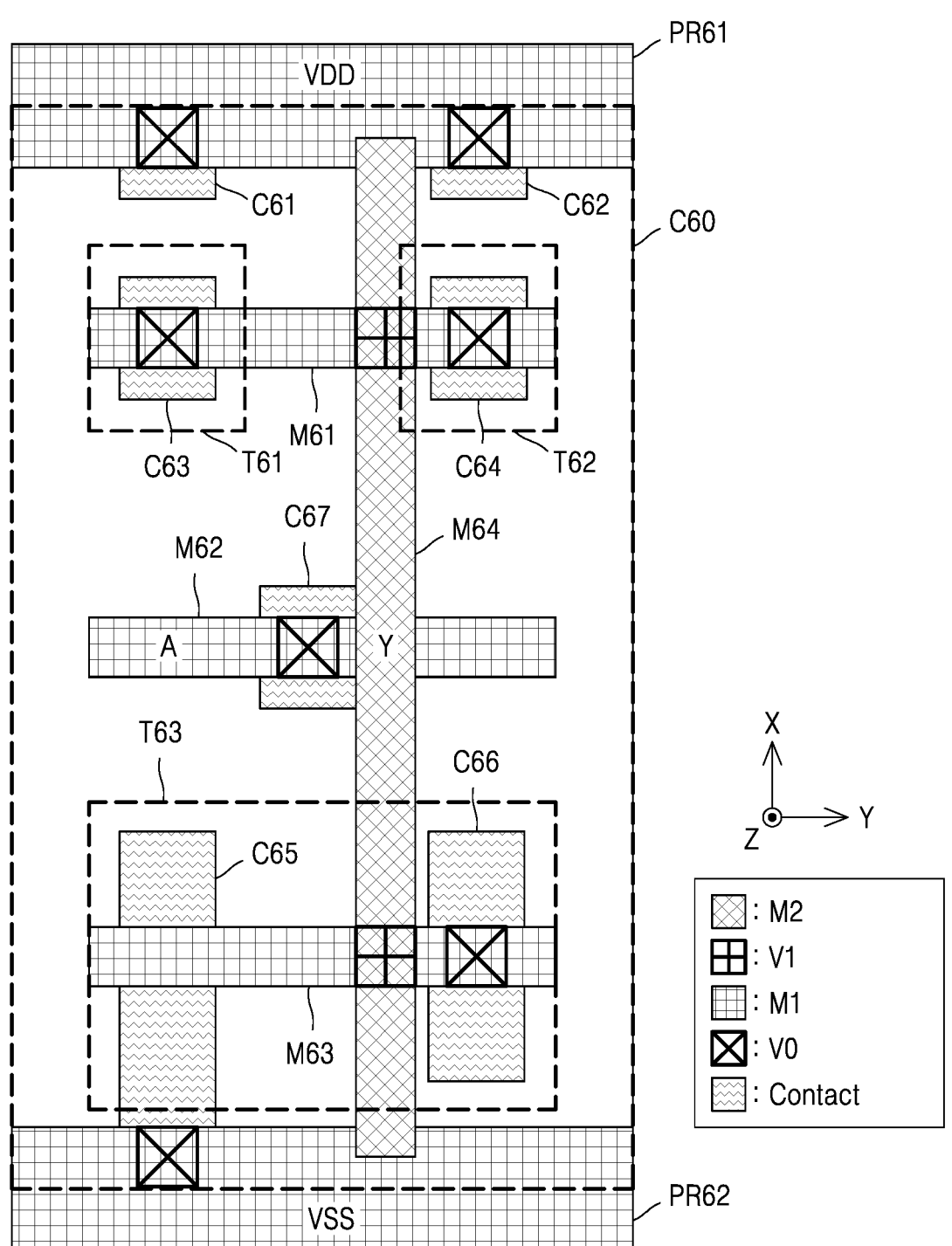

FIGS. 6A and 6B are respectively plan views of the layouts of a cell according to an example embodiment. In detail, the plan view of FIG. 6A shows patterns of a front-end-of-line (FEOL) of a cell C60, which functions as an inverter having an input A and an output Y, and the plan view of FIG. 6B shows patterns of a middle-of-line (MOL) and a back-end-of-line (BEOL) of the cell C60.

Referring to FIG. 6A, the cell C60 may include a first VFET T61, a second VFET T62, and an LFET T63. Each of the first VFET T61 and the second VFET T62 may be a PFET, and the LFET T63 may be an NFET. The first VFET T61 and the second VFET T62 may respectively overlap with the source and drain of the LFET T63 in the X-axis direction. A first gate VG1 of the first VFET T61, a second gate VG2 of the second VFET T62, and a third gate LG3 of the LFET T63 may extend in the X-axis direction and may be electrically connected to one another by a gate pattern PC formed in the same layer as the first to third gates VG1, VG2, and LG3. The first VFET T61 may include a bottom source/drain, i.e., a first source VS1, and a top source/drain, i.e., a first drain VD1. The second VFET T62 may include a bottom source/drain, i.e., a second source VS2, and a top source/drain, i.e., a second drain VD2. The LFET T63 may include a third source LS3 and a third drain LD3.

Referring to FIG. 6B, the first source VS1 of the first VFET T61 may be electrically connected to a first power rail PR61 through a first contact C61, and the second source VS2 of the second VFET T62 may be electrically connected to the first power rail PR61 through a second contact C62. The first drain VD1 of the first VFET T61 may be electrically connected to a first metal pattern M61 in an M1 layer through a third contact C63, and the second drain VD2 of the second VFET T62 may be electrically connected to the first metal pattern M61 through a fourth contact C64. The third source LS3 of the LFET T63 may be electrically connected to a second power rail PR62 through a fifth contact C65, and the third drain LD3 of the LFET T63 may be electrically connected to a third metal pattern M63 in the M1 layer through a sixth contact C66. The gate pattern PC may be electrically connected to a second metal pattern M62 in the M1 layer through a seventh contact C67. The first metal pattern M61 and the third metal pattern M63 may be electrically connected to a fourth metal pattern M64 in an M2 layer through vias in a first via layer V1.

Figure 7A:
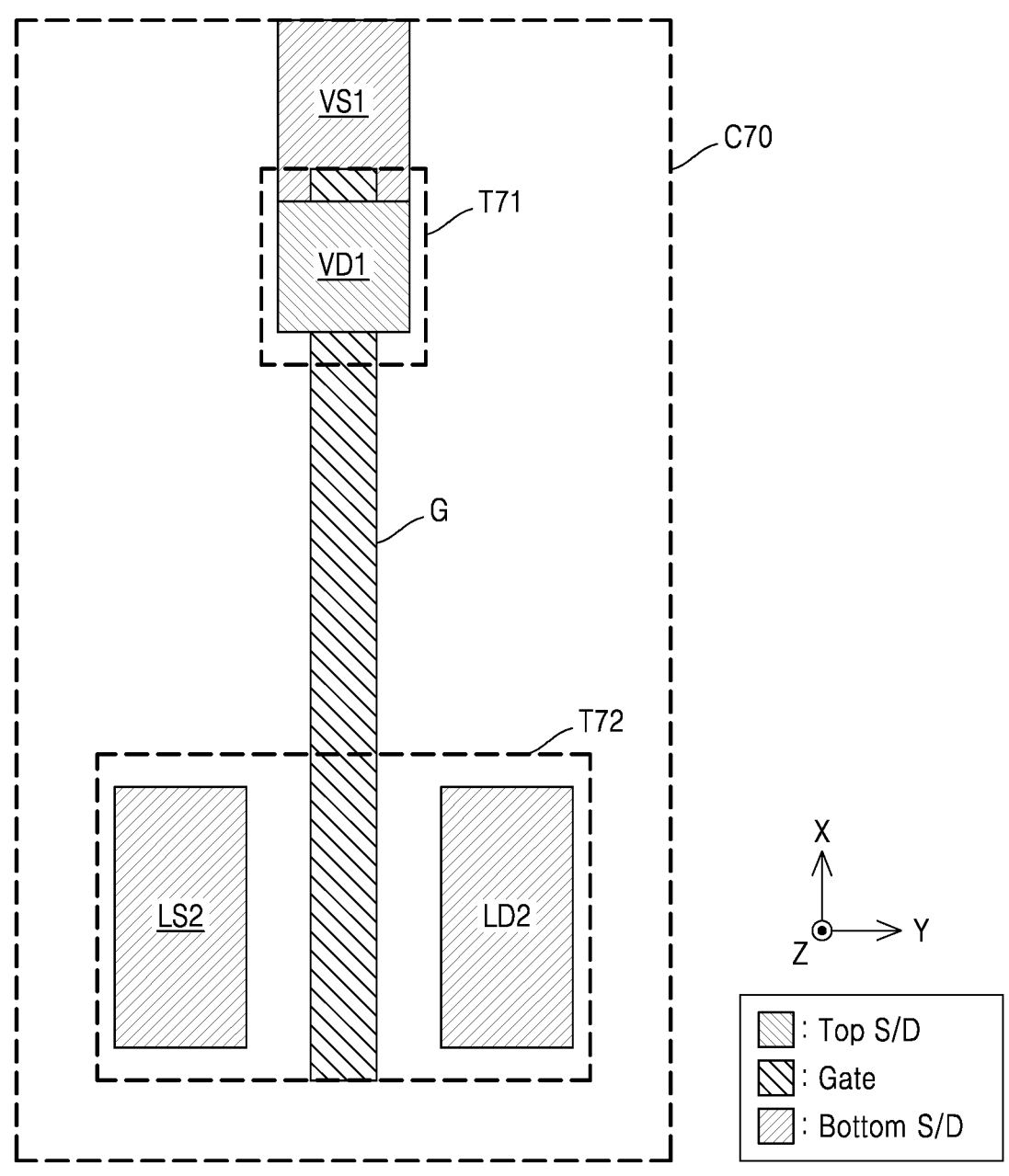
FIGS. 7A and 7B are respectively plan views of the layouts of a cell according to an example embodiment.
Figure 7B:
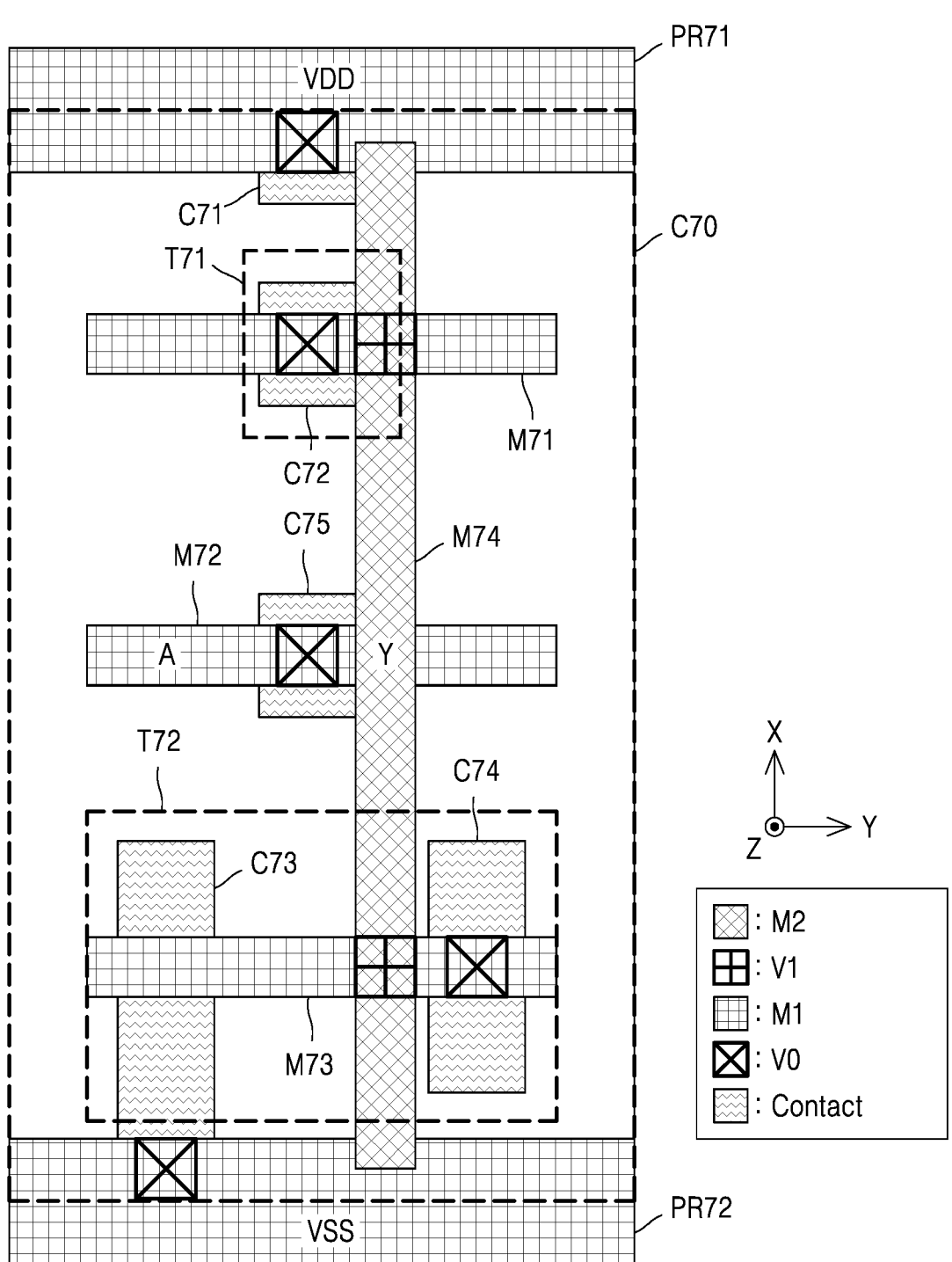

FIGS. 7A and 7B are respectively plan views of the layouts of a cell according to an example embodiment. In detail, the plan view of FIG. 7A shows patterns of an FEOL of a cell C70, which functions as an inverter having an input A and an output Y, and the plan view of FIG. 7B shows patterns of an MOL and a BEOL of the cell C70. Referring to FIG. 7A, the cell C70 may include a VFET T71 and an LFET T72. The VFET T71 may include a PFET, and the LFET T72 may include an NFET. The VFET T71 may overlap with a gate of the LFET T72 in the X-axis direction. A gate G of the VFET T71 and a gate G of the LFET T72 may extend in the X-axis direction to be connected to each other. The VFET T71 may include a bottom source/drain, i.e., a first source VS1, and a top source/drain, i.e., a first drain VD1. The LFET T72 may include a second source LS2 and a second drain LD2.

Referring to FIG. 7B, the first source VS1 of the VFET T71 may be electrically connected to a first power rail PR71 through a first contact C71, and the first drain VD1 of the VFET T71 may be electrically connected to a first metal pattern M71 in the M1 layer through a second contact C72. The second source LS2 of the LFET T72 may be electrically connected to a second power rail PR72 through a third contact C73, and the second drain LD2 of the LFET T72 may be electrically connected to a third metal pattern M73 in the M1 layer through a fourth contact C74. The gates G may be electrically connected to a second metal pattern M72 in the M1 layer through a fifth contact C75. The first metal pattern M71 and the third metal pattern M73 may be electrically connected to a fourth metal pattern M74 in the M2 layer through vias in the first via layer V1.

Figure 8:
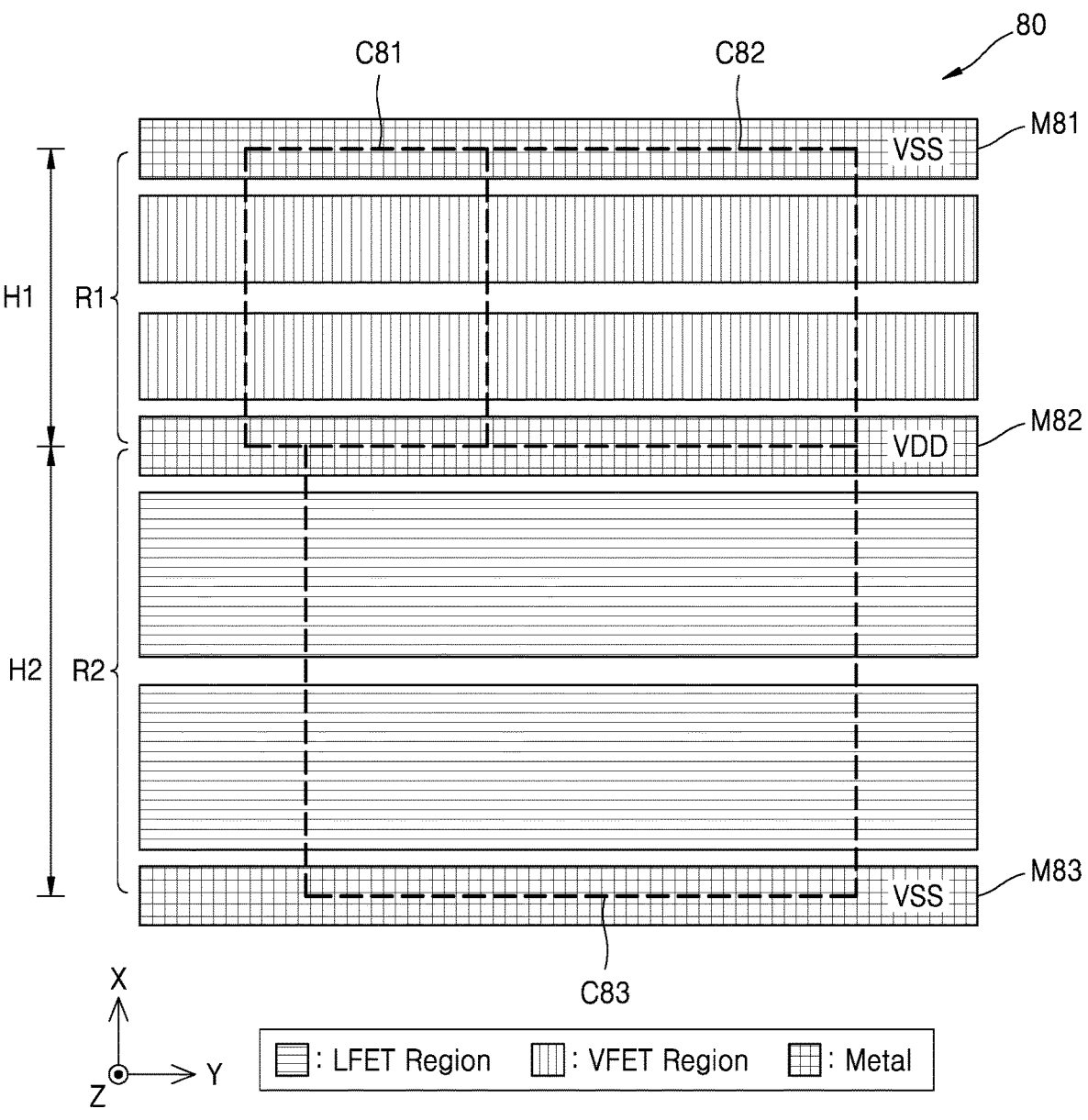
FIG. 8 is a plan view of the layout of an IC according to an example embodiment.

FIG. 8 is a plan view of the layout of an IC according to an example embodiment. In some embodiments, an IC 80 may include a plurality of blocks, and each of the blocks may include homogeneous devices. The IC 80 may include a pattern, which crosses the boundary between blocks, to electrically connect heterogeneous devices respectively included in the blocks. Referring to FIG. 8, a first row R1 and a second row R2 may extend in the Y-axis direction, and cells may be arranged in the first and second rows R1 and R2. For example, a first cell C81 and a second cell C82 may be in the first row R1, and a third cell C83 may be in the second row R2. Power rails, which supply power to cells, may be respectively at boundaries of the first and second rows R1 and R2 and extend in the Y-axis direction. For example, first and third metal patterns M81 and M83, to which the negative supply voltage VSS is applied, and a second metal pattern M82, to which the positive supply voltage VDD is applied, may extend in the Y-axis direction.

The first row R1 may be included in a first block, and the first block may include VFETs. For example, as shown in FIG. 8, two VFET regions may extend in the Y-axis direction in parallel with each other in the first row R1, and each of the first and second cells C81 and C82 may include at least one VFET formed in the two VFET regions. Two LFET regions may extend in the Y-axis direction in parallel with each other in the second row R2, and the third cell C83 may include at least one LFET formed in the two LFET regions. NFETs may be formed in LFET regions and VFET regions, which are adjacent to power rails to which the negative supply voltage VSS is applied. PFETs may be formed in LFET regions and VFET regions, which are adjacent to power rails to which the positive supply voltage VDD is applied.

In some embodiments, a first width H1 of the first row R1 may be the same as or different from a second width H2 of the second row R2. For example, as shown in FIG. 8, the second width H2 of the second row R2 may be greater than the first width H1 of the first row R1 (i.e., H2>H1). The IC 80 may include various combinations of rows including VFETs and rows including LFETs. For example, rows including VFETs may alternate with rows including LFETs at a ratio of 1:1, 2:2, 4:4, or the like.

Figure 9:
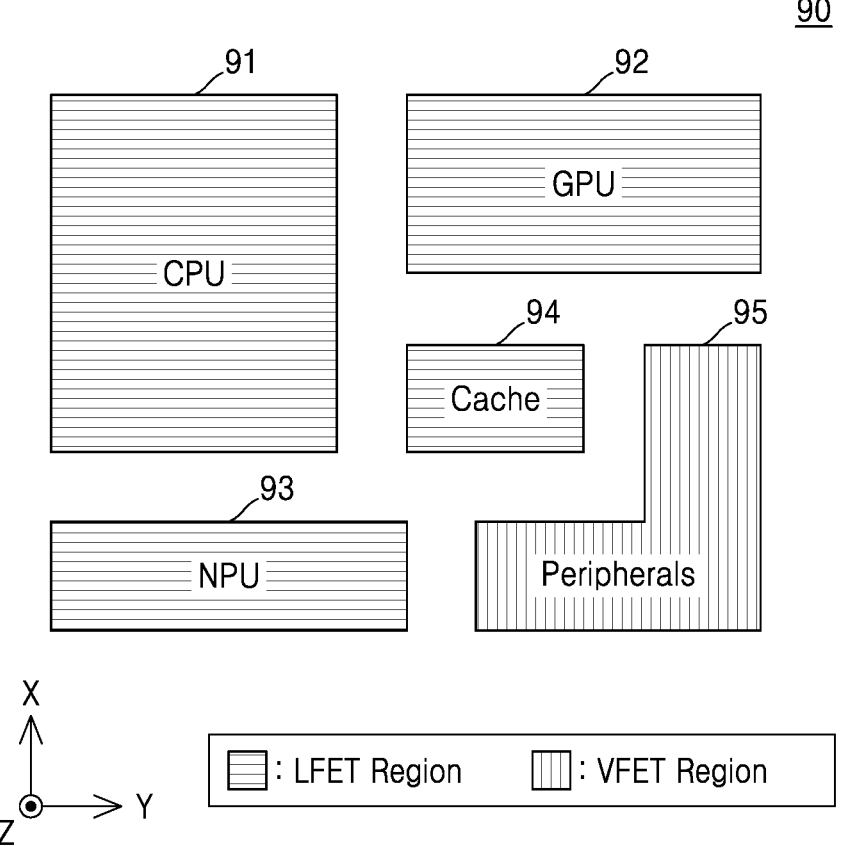
FIG. 9 is a plan view of the layout of an IC according to an example embodiment.

FIG. 9 is a plan view of the layout of an IC according to an example embodiment. In some embodiments, an IC may include a plurality of modules. A module may refer to a circuit unit that is designed independently of other modules. For example, as shown in FIG. 9, an IC 90 may include a central processing unit (CPU) 91, a graphics processing unit (GPU) 92, a neural processing unit (NPU) 93, a cache 94, and peripherals 95. The CPU 91, the GPU 92, the NPU 93, the cache 94, and the peripherals 95 may be designed independently of one another.

Each module may include homogeneous devices. For example, as shown in FIG. 9, the CPU 91, the GPU 92, the NPU 93, and the cache 94, which require relatively high performance, may include LFETs. The peripherals 95 may include, for example, a display engine, a memory controller, a communication interface and require a relatively low speed. Accordingly, as shown in FIG. 9, the peripherals 95 may include VFETs and have a reduced area.

Figure 10A:
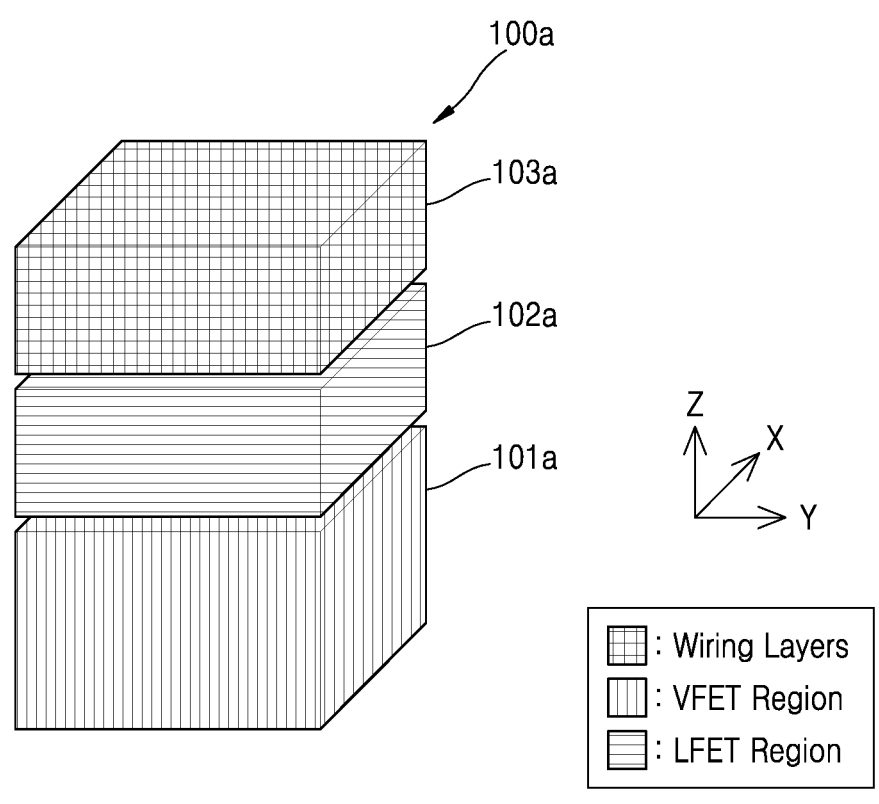
FIGS. 10A and 10B are diagrams of examples of ICs according to example embodiments.
Figure 10B:
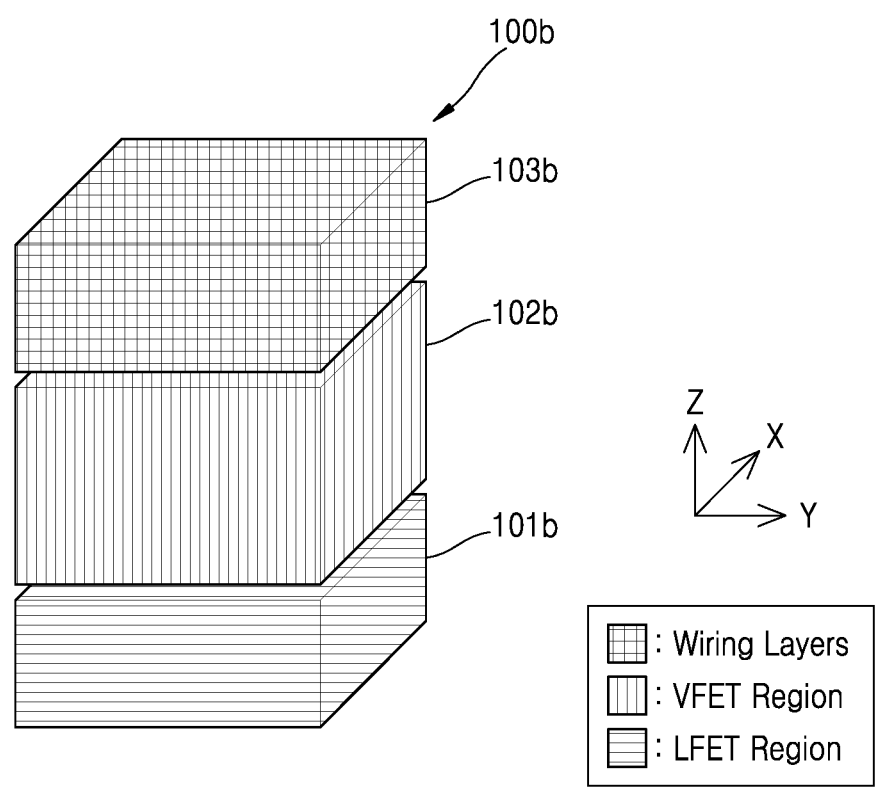

FIGS. 10A and 10B are diagrams of examples of ICs according to example embodiments. In some embodiments, an IC may include stacked heterogeneous devices. Referring to FIG. 10A, an IC 100a may include a VFET region 101a, an LFET region 102a, and wiring layers 103a. The VFET region 101a, the LFET region 102a, and the wiring layers 103a may be sequentially stacked. Accordingly, LFETs formed in the LFET region 102a may be above VFETs formed in the VFET region 101a, and the IC 100a may include a connection structure electrically connecting the VFETs to the LFETs. Examples of electrically connecting a VFET to an LFET in a structure in which the VFET region 101a, the LFET region 102a, and the wiring layers 103a are sequentially stacked are described below with reference to FIGS. 11A and 11B. The wiring layers 103a may include at least one metal layer and at least one via layer.

Referring to FIG. 10B, an IC 100b may include an LFET region 101b, a VFET region 102b, and wiring layers 103b. The LFET region 101b, the VFET region 102b, and the wiring layers 103b may be sequentially stacked. Accordingly, VFETs formed in the VFET region 102b may be above LFETs formed in the LFET region 101b, and the IC 100b may include a connection structure electrically connecting the VFETs to the LFETs. Examples of electrically connecting a VFET to an LFET in a structure in which the LFET region 101b, the VFET region 102b, and the wiring layers 103b are sequentially stacked are described below with reference to FIG. 12. The wiring layers 103b may include at least one metal layer and at least one via layer.

In some embodiments, a cell may include at least one LFET and at least one VFET, which are stacked. For example, similarly to the description given with reference to FIGS. 5A and 5B, a cell including a stack of an LFET and a VFET may be arranged in a row, and the widths of respective rows may be the same as or different from each other. In some embodiments, an LFET may include an NFET, and a VFET may include a PFET. In some embodiments, an LFET may include a PFET, and a VFET may include an NFET.

Figure 11A:
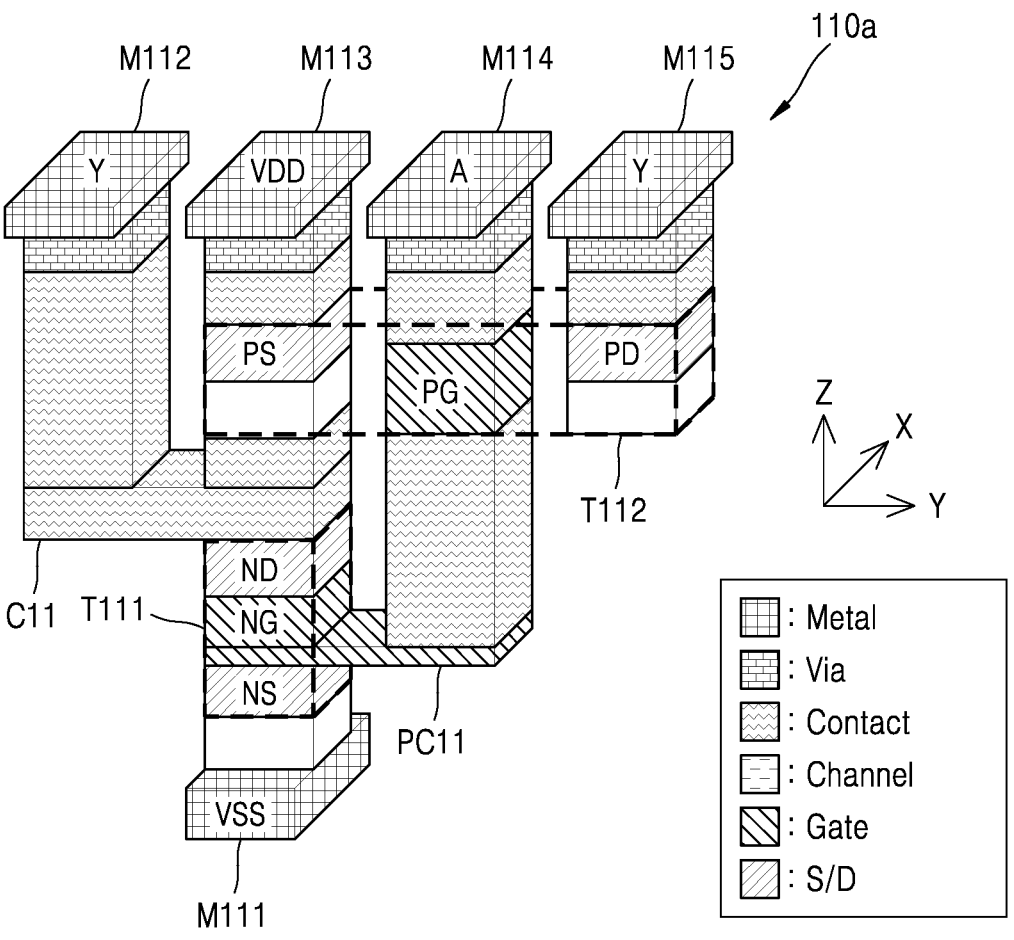
FIGS. 11A and 11B are diagrams of examples of ICs according to example embodiments.
Figure 11B:
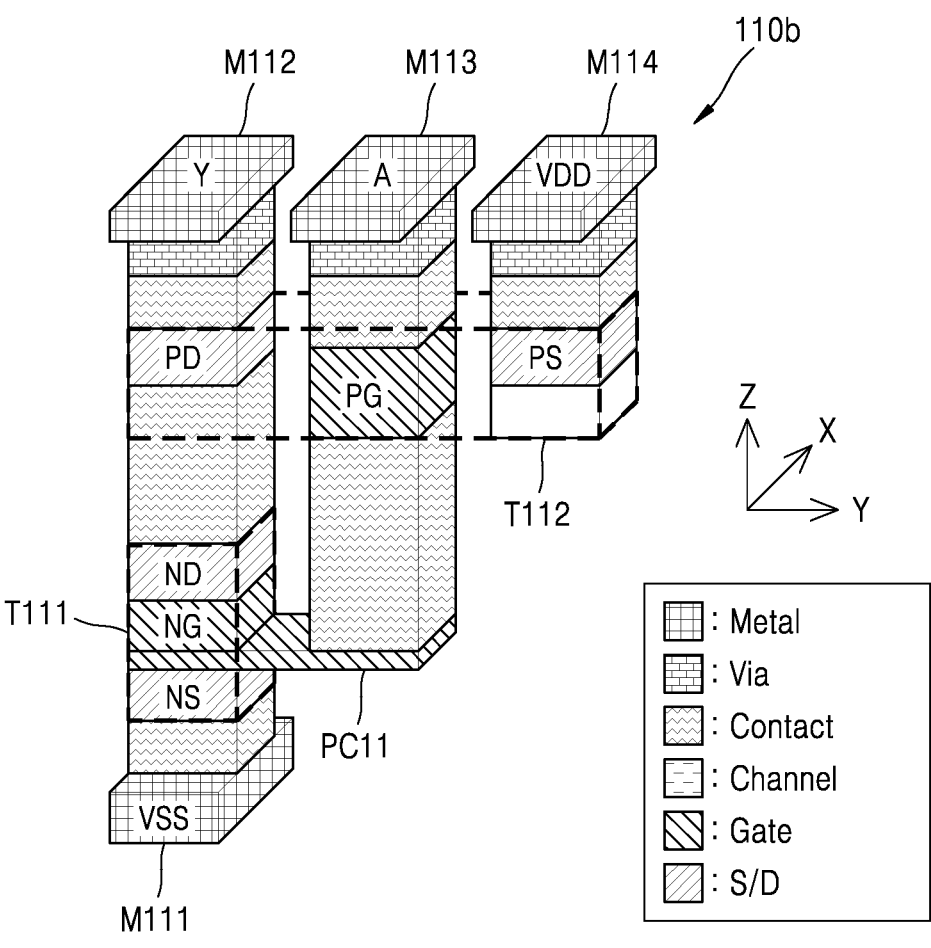

FIGS. 11A and 11B are diagrams of examples of ICs according to example embodiments. In detail, FIGS. 11A and 11B respectively illustrate cells 110a and 110b that may each function as an inverter having the input A (at M114) and the output Y (at M115). Referring to FIG. 11A, the cell 110a may include a VFET T111 and an LFET T112. As shown in FIG. 11A, the LFET T112 may be above the VFET T111, and the VFET T111 may overlap with a source PS of the LFET T112 in the Z-axis direction. The VFET T111 may be an NFET and may include a source NS, a gate NG, and a drain ND. The LFET T112 may be a PFET and may include the source PS, a gate PG, and a drain PD.

The source NS of the VFET T111 may be electrically connected to a first metal pattern M111, to which the negative supply voltage VSS is applied. In some embodiments, as described below with reference to FIGS. 13A and 13D, the first metal pattern M111 may correspond to a buried power rail or a backside power rail and may include a metal or a conductive material other than a metal. The drain ND of the VFET T111 may be electrically connected to a second metal pattern M112 corresponding to the output Y through a contact C11 extending in the Y-axis direction. The gate NG of the VFET T111 may be electrically connected to the gate PG of the LFET T112 through a gate pattern PC11 extending in the Y-axis direction. The source PS of the LFET T112 may be electrically connected to a third metal pattern M113, to which the positive supply voltage VDD is applied. The gate PG of the LFET T112 may be electrically connected to a fourth metal pattern M114 corresponding to the input A. The drain PD of the LFET T112 may be electrically connected to a fifth metal pattern M115 corresponding to the output Y.

Referring to FIG. 11B, the cell 110b may include the VFET T111 and the LFET T112. As shown in FIG. 11B, the LFET T112 may be above the VFET T111, and the VFET T111 may overlap with the drain PD of the LFET T112 in the Z-axis direction. The VFET T111 may be an NFET and may include the source NS, the gate NG, and the drain ND. The LFET T112 may be a PFET and may include the source PS, the gate PG, and the drain PD.

The source NS of the VFET T111 may be electrically connected to the first metal pattern M111, to which the negative supply voltage VSS is applied. In some embodiments, as described below with reference to FIGS. 13A and 13D, the first metal pattern M111 may correspond to a buried power rail or a backside power rail and may include a metal or a conductive material other than a metal. The drain ND of the VFET T111 may be electrically connected to the drain PD of the LFET T112. The gate NG of the VFET T111 may be electrically connected to the gate PG of the LFET T112 through the gate pattern PC11 extending in the Y-axis direction. The drain PD of the LFET T112 may be electrically connected to the second metal pattern M112 corresponding to the output Y. The gate PG of the LFET T112 may be electrically connected to the third metal pattern M113 corresponding to the input A. The source PS of the LFET T112 may be electrically connected to the fourth metal pattern M114, to which the positive supply voltage VDD is applied.

Figure 12:
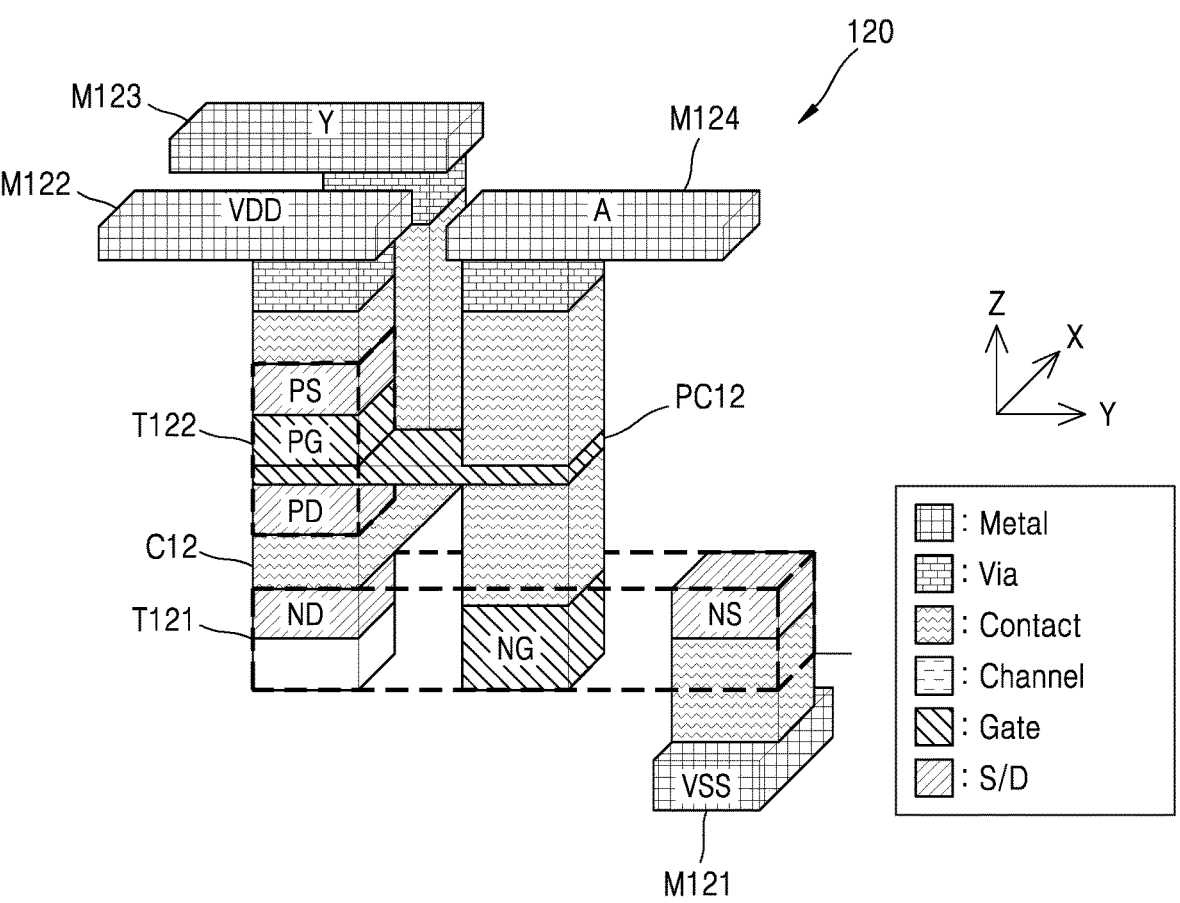
FIG. 12 is a diagram of an IC according to an example embodiment.

FIG. 12 is a diagram of an IC according to an example embodiment. In detail, FIG. 12 illustrates a cell 120 that functions as an inverter including the input A and the output Y. Referring to FIG. 12, the cell 120 may include an LFET T121 and a VFET T122. As shown in FIG. 12, the VFET T122 may be above the LFET T121, and the VFET T122 may overlap with the drain ND of the LFET T121 in the Z-axis direction. The LFET T121 may be an NFET and may include the source NS, the gate NG, and the drain ND. The VFET T122 may be a PFET and may include the source PS, the gate PG, and the drain PD.

The source NS of the LFET T121 may be electrically connected to a first metal pattern M121, to which the negative supply voltage VSS is applied. In some embodiments, as described below with reference to FIGS. 13A and 13D, the first metal pattern M121 may correspond to a buried power rail or a backside power rail and may include a metal or a conductive material other than a metal. The drain ND of the LFET T121 and the drain PD of the VFET T122 may be electrically connected to a third metal pattern M123, which corresponds to the output Y, through a contact C12 extending in the X-axis direction. The gate NG of the LFET T121 may be electrically connected to the gate PG of the VFET T122 through a gate pattern PC12 extending in the Y-axis direction. The source PS of the VFET T122 may be electrically connected to a second metal pattern M122, to which the positive supply voltage VDD is applied. The gate PG of the VFET T122 may be electrically connected to a fourth metal pattern M114, which corresponds to the input A, through the gate pattern PC12 extending in the Y-axis direction.

Figure 13A:
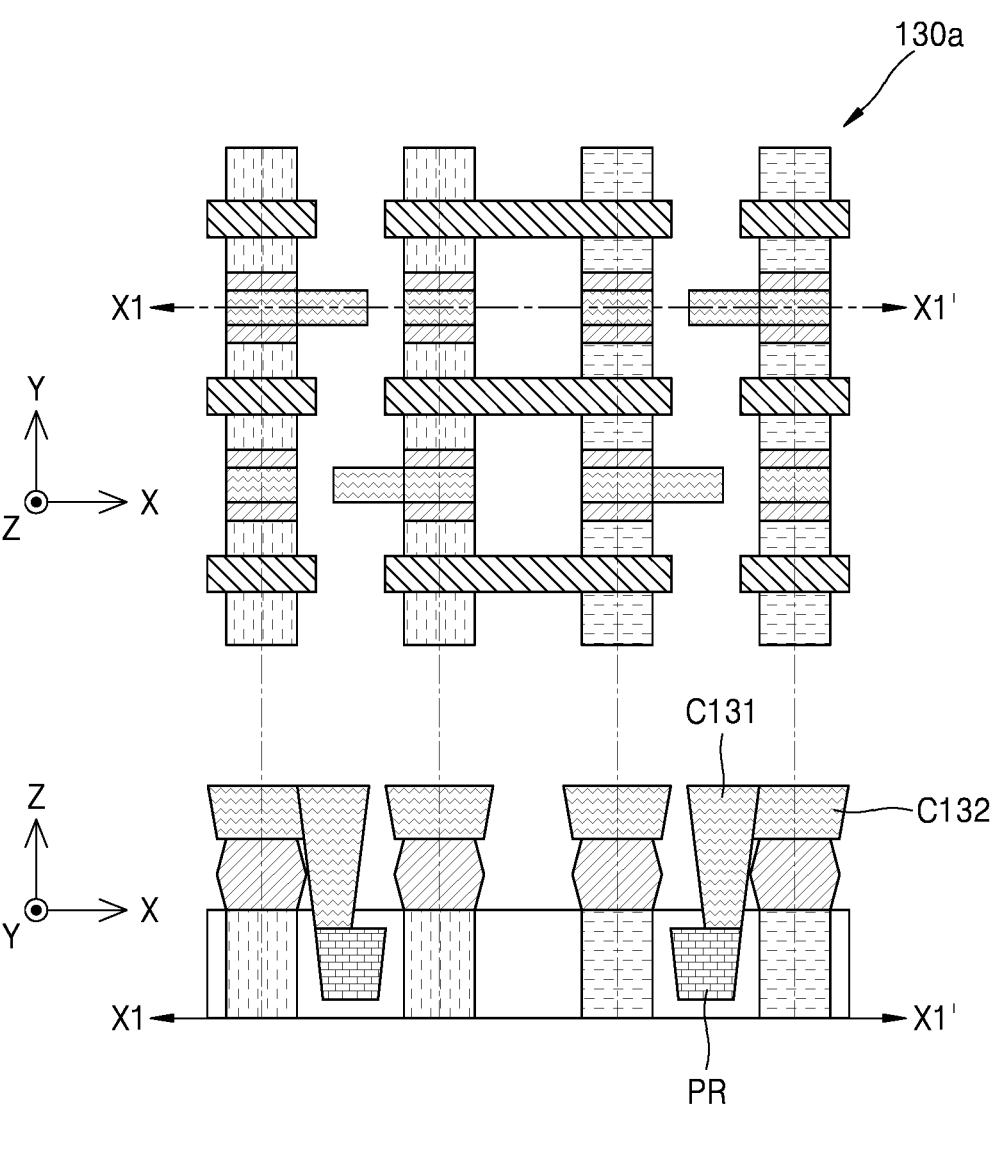
FIGS. 13A to 13D are respectively diagrams illustrating the layouts of ICs according to example embodiments.
Figure 13B:
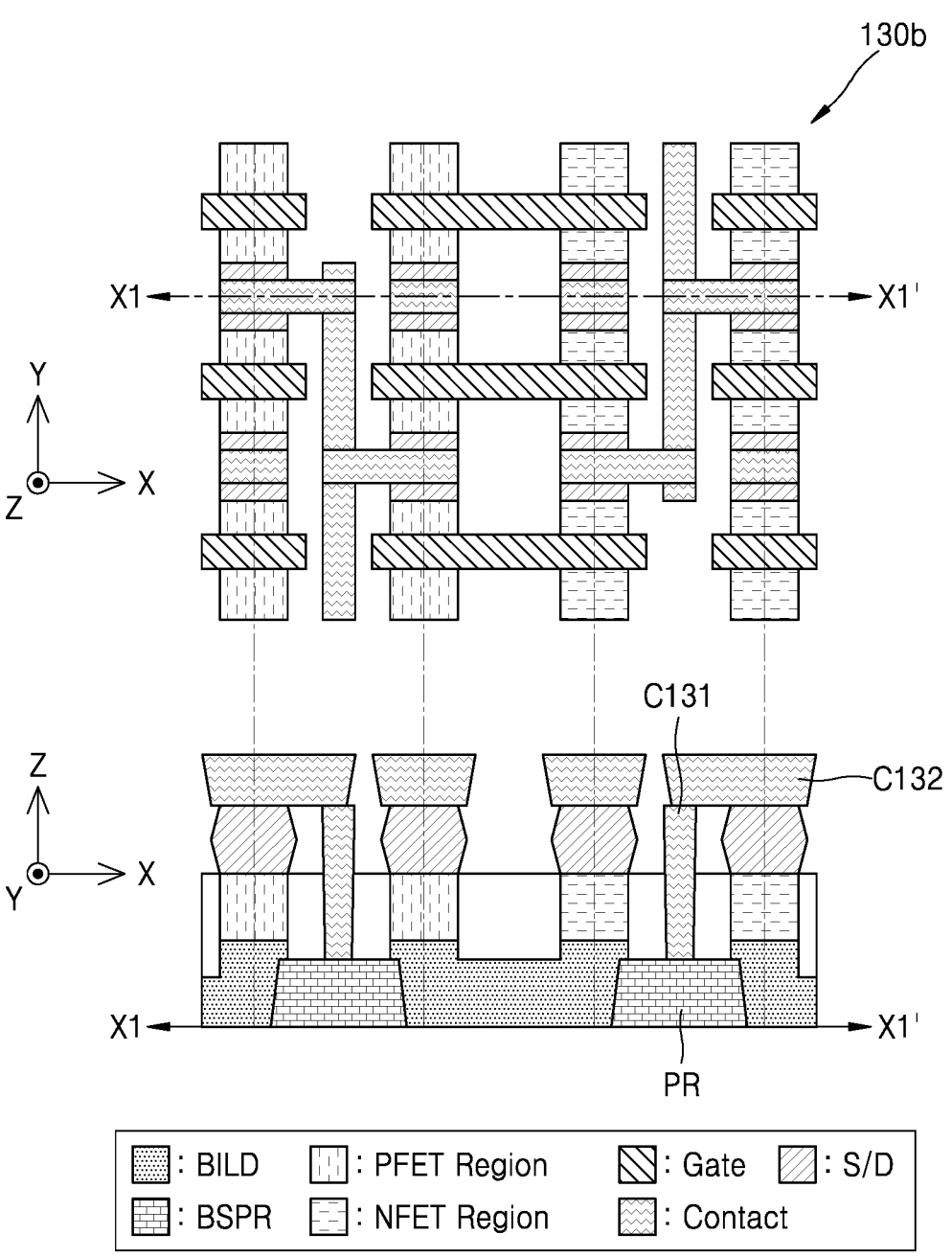
Figure 13C:
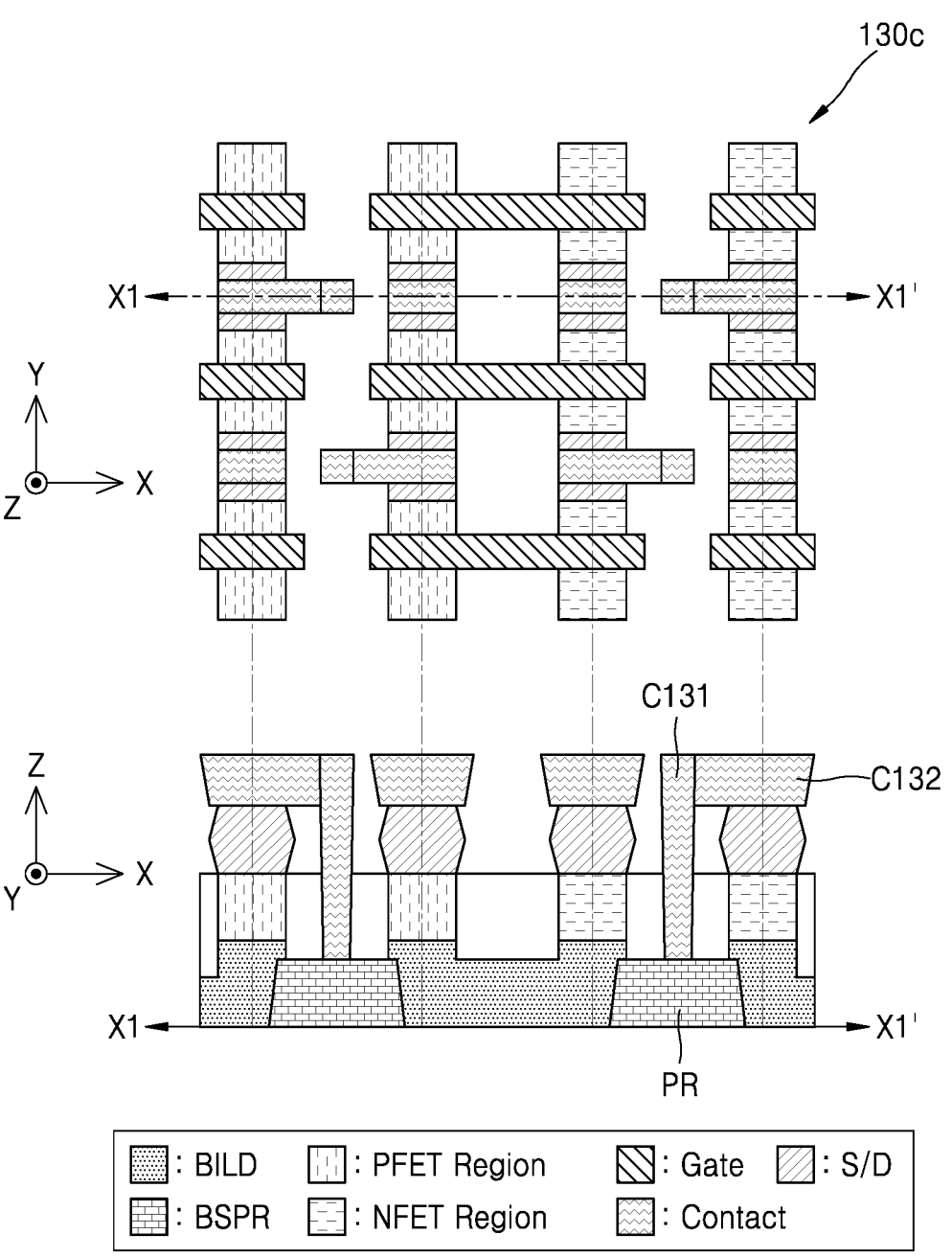
Figure 13D:
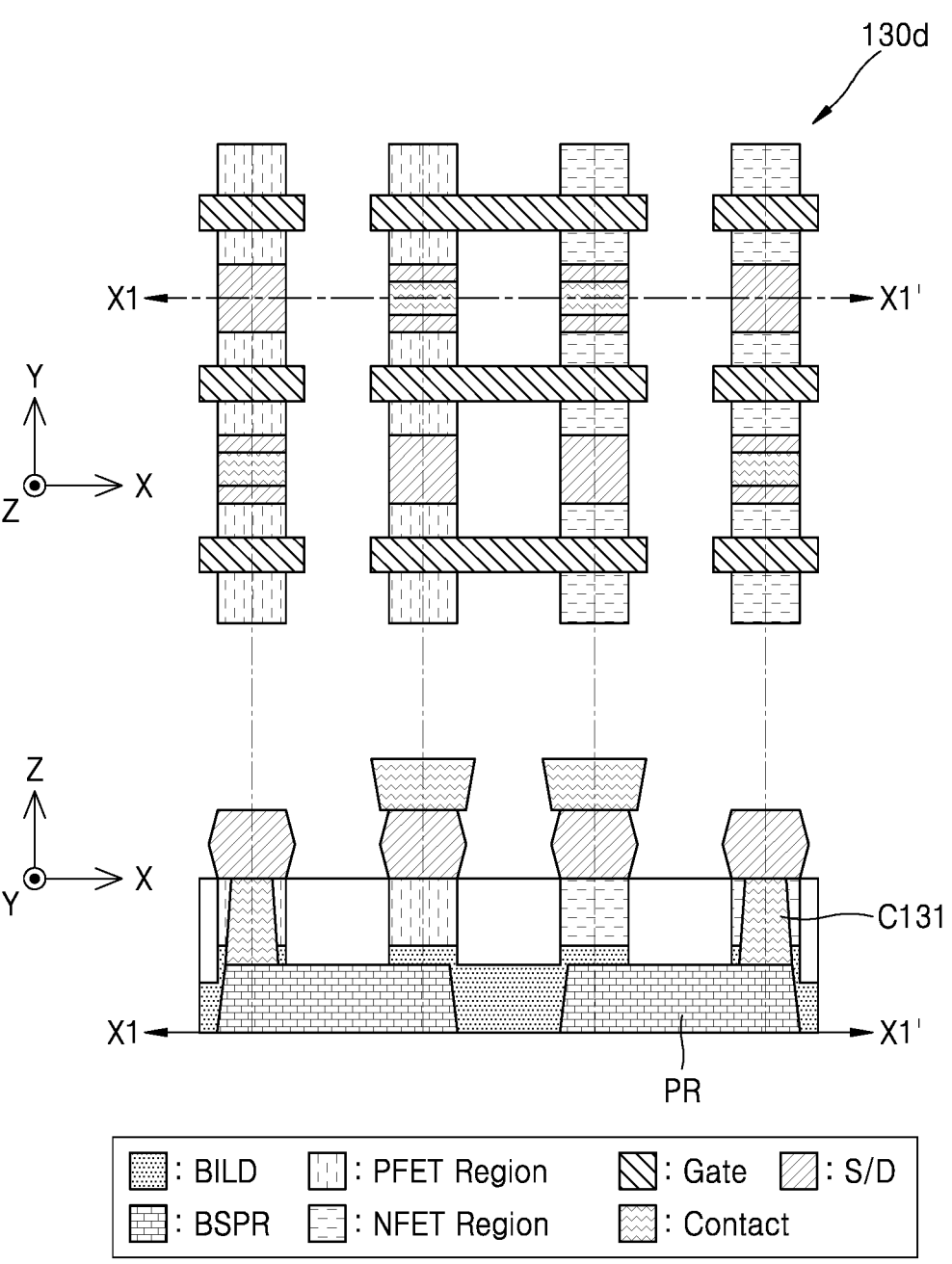

FIGS. 13A to 13D are respectively diagrams illustrating the layouts of ICs according to example embodiments. FIGS. 13A to 13D show a plan view of an IC and a cross-sectional view of the IC taken along line X1-X1'. In some embodiments, an IC may include a buried power rail or a backside power rail. FIG. 13A shows an example of a buried power rail (BPR), and FIGS. 13B to 13D show examples of backside power rails (BSPRs). A BPR and a BSPR may include a conductive material.

Referring to the plan view in FIG. 13A, an IC 130a may include gates, which extend in the X-axis direction, and NFET regions and PFET regions, which extend in the Y-axis direction. BPRs may extend in the Y-axis direction among transistors. For example, as shown in the cross-sectional view in FIG. 13A, a power rail PR may extend in the Y-axis direction between NFET regions. The IC 130a may include a first contact C131 connected to the power rail PR, and the first contact C131 may be connected to a second contact C132 connected to a source/drain.

Referring to the plan view in FIG. 13B, an IC 130b may include gates, which extend in the X-axis direction, and NFET regions and PFET regions, which extend in the Y-axis direction. BSPRs may extend in the Y-axis direction below the NFET and PFET regions. For example, as shown in the cross-sectional view in FIG. 13B, the power rail PR may extend in the Y-axis direction below the NFET regions. Backside interlayer dielectric (BILD) may be between BSPRs. The IC 130b may include the first contact C131 connected to the power rail PR, and the top surface of the first contact C131 may be connected to the bottom surface of the second contact C132, which is connected to a source/drain and extends in the X-axis direction.

Referring to the plan view in FIG. 13C, an IC 130c may include gates, which extend in the X-axis direction, and NFET regions and PFET regions, which extend in the Y-axis direction. BSPRs may extend in the Y-axis direction below the NFET and PFET regions. BILD may be between BSPRs. For example, as shown in the cross-sectional view in FIG. 13C, the power rail PR may extend in the Y-axis direction below the NFET regions. The IC 130c may include the first contact C131 connected to the power rail PR, and a side surface of the first contact C131 may be connected to a side surface of the second contact C132, which is connected to a source/drain and extends in the X-axis direction.

Referring to the plan view in FIG. 13D, an IC 130d may include gates, which extend in the X-axis direction, and NFET regions and PFET regions, which extend in the Y-axis direction. BSPRs may extend in the Y-axis direction below the NFET and PFET regions and overlap with the NFET regions or the PFET region in the Z-axis direction. Backside interlayer dielectric (BILD) may be between BSPRs. For example, as shown in the cross-sectional view in FIG. 13D, the power rail PR may extend in the Y-axis direction below the NFET regions and overlap with the NFET regions in the Z-axis direction. The first contact C131 may pass through an NFET region and may be connected to a source/drain.

Figure 14:
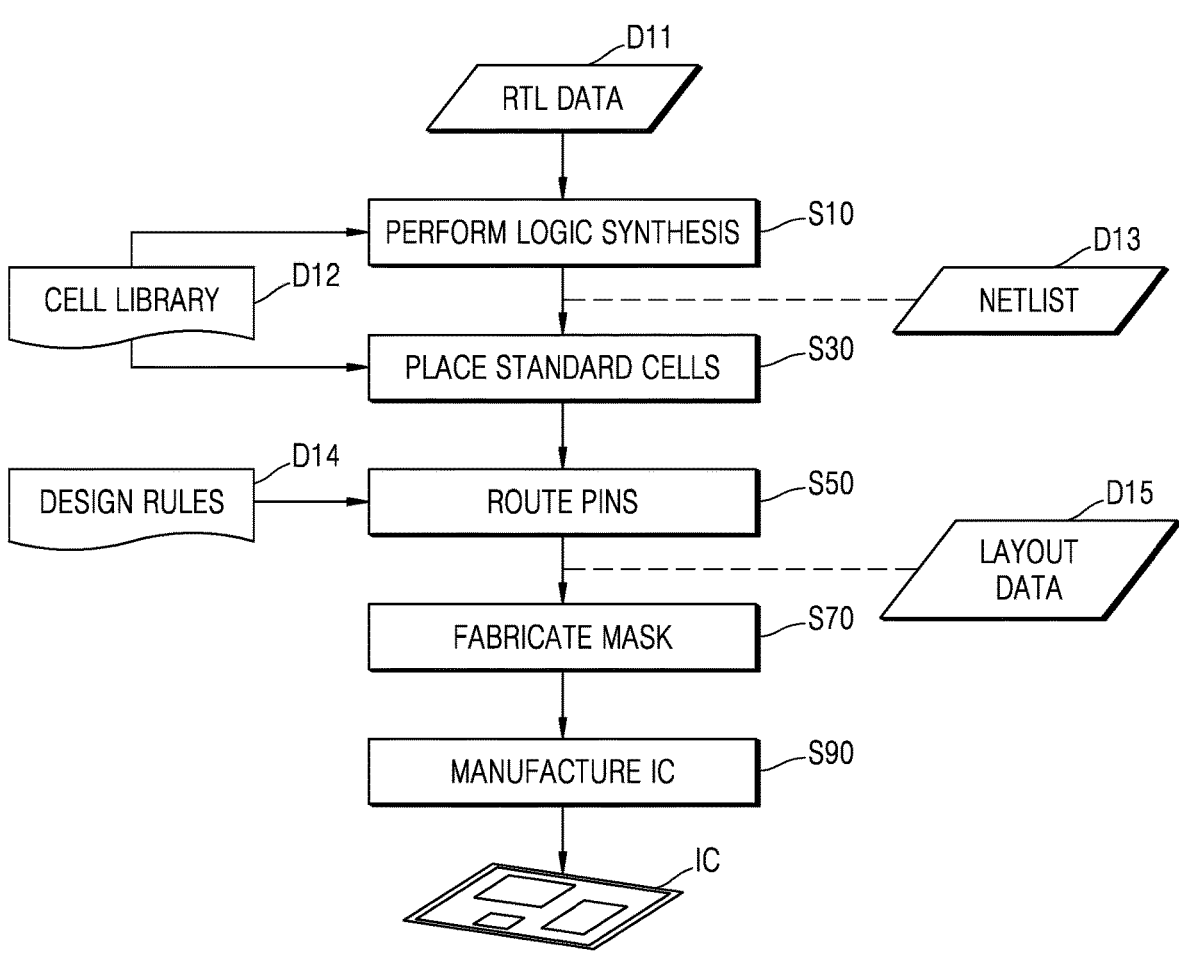
FIG. 14 is a flowchart of a method of fabricating an IC, according to an example embodiment.

FIG. 14 is a flowchart of a method of manufacturing an IC, according to an example embodiment. In detail, the flowchart of FIG. 14 shows an example of a method of manufacturing an IC including standard cells. As shown in FIG. 14, the method of manufacturing an IC may include operations S10, S30, S50, S70, and S90. As shown, a cell library (or a standard cell library) D12 may include information about standard cells, e.g., information about functions, characteristics, layouts, or the like of standard cells. In some embodiments, the cell library D12 may define a standard cell including heterogeneous devices, e.g., at least one VFET and at least one LFET. In some embodiments, the cell library D12 may define a standard cell including only at least one VFET and a standard cell including at least one LFET. In some embodiments, the cell library D12 may define standard cells having various heights.

Design rules D14 may include requirements for the layout of an IC. For example, the design rules D14 may include requirements for the spacing between patterns in one layer, the minimum width of a pattern, the routing direction of a wiring layer, and the like. In some embodiments, the design rules D14 may define a minimum spacing in a track of a wiring layer.

Logic synthesis, by which a netlist D13 is generated from RTL data D11, may be performed in operation S10. For example, a semiconductor design tool (e.g., a logic synthesis tool) may perform logic synthesis on the RTL data D11, which is written in very high speed IC (VHSIC) hardware description language (HDL) (VHDL) and HDL like Verilog, with reference to the cell library D12, and generate the netlist D13. The netlist D13 may correspond to the input of placement and routing, which is described below.

Cells may be placed in operation S30. For example, a semiconductor design tool (e.g., a P&R tool) may place standard cells, which are used in the netlist D13, with reference to the cell library D12. In some embodiments, a semiconductor design tool may select a standard cell, which includes heterogeneous devices, from the cell library D12 and place the selected standard cell. In some embodiments, a semiconductor design tool may select a standard cell from the cell library D12 such that homogeneous devices are included in one block, and place the selected standard cell. In some embodiments, a semiconductor design tool may select a standard cell from the cell library D12 such that homogeneous devices are included in one module, and place the selected standard cell.

The pins of the standard cells may be routed in operation S50. For example, a semiconductor design tool may generate interconnections that electrically connect the output and input pins of placed standard cells and generate layout data D15 that defines the placed standard cells and the interconnections. An interconnection may include a via of a via layer and/or a pattern of a wiring layer. In some embodiments, interconnections may include a pattern that connects heterogeneous devices to each other. For example, the layout data D15 may has a format like GDSII and include geometrical information of cells and interconnections. A semiconductor design tool may refer to the design rules D14 while routing the pins of cells. The layout data D15 may correspond to the output of placement and routing. Operation S50 may be solely or operations S30 and S50 may be collectively referred to as a method of designing an IC.

A mask may be fabricated in operation S70. For example, optical proximity correction (OPC) for correcting distortion, such as refraction, caused by the characteristics of light in photolithography may be performed on the layout data D15. Patterns on a mask may be defined to form patterns arranged in a plurality of layers, based on data that has undergone OPC, and at least one mask (or photomask) for forming patterns of each layer may be fabricated. In some embodiments, the layout of an IC may be limitedly modified in operation S70. Limitedly modifying an IC in operation S70 may be post processing for optimizing the structure of the IC and referred to as design polishing.

An IC may be manufactured in operation S90. For example, an IC may be manufactured by patterning a plurality of layers by using at least one mask, which is fabricated in operation S70. For example, FEOL may include planarizing and cleaning a wafer, forming a trench, forming a well, forming a gate electrode, and forming a source and a drain. Individual devices, e.g., transistors, capacitors, resistors, etc., may be formed in a substrate via the FEOL. BEOL (back end-of-the-line) may include silicidation of a gate and source and drain regions, adding a dielectric, planarization, forming a hole, adding a metal layer, forming a via, and forming a passivation layer. The individual devices, e.g., transistors, capacitors, resistors, etc., may be interconnected with each other via the BEOL. In some embodiments, MOL may be performed between FEOL and BEOL such that contacts may be formed on individual devices. Thereafter, the IC may be packaged in a semiconductor package and used as a component of various applications.

Figure 15:
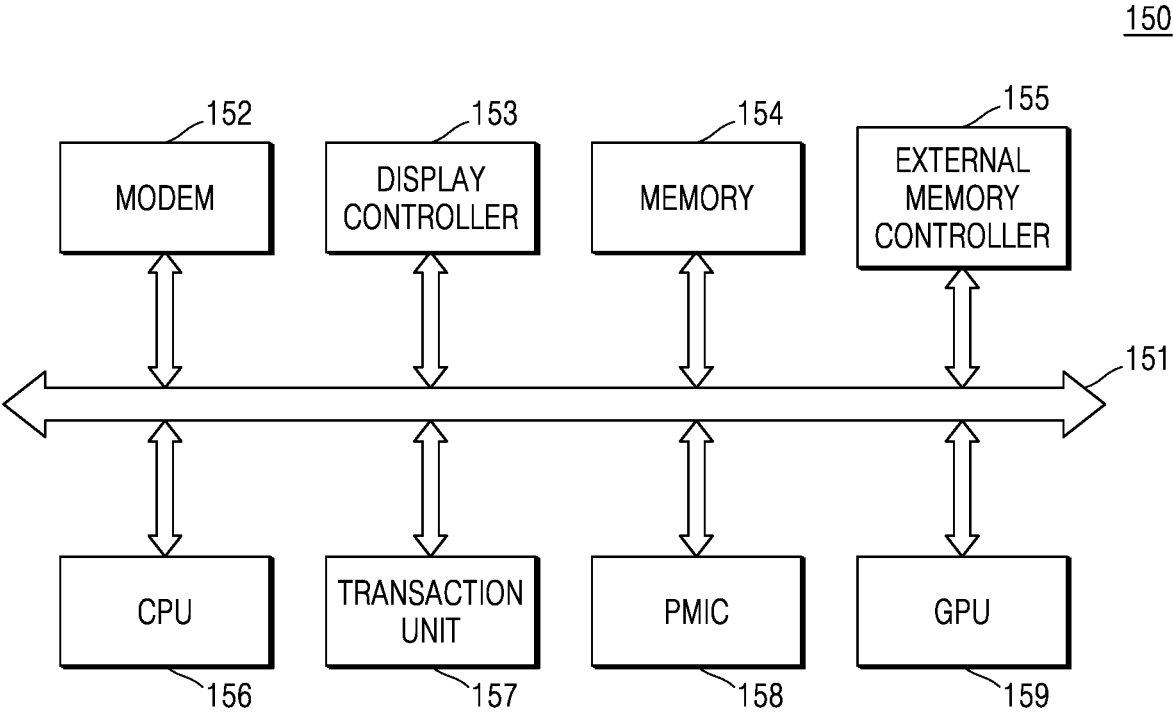
FIG. 15 is a block diagram of a system-on-chip (SoC) according to an example embodiment.

FIG. 15 is a block diagram of a system-on-chip (SoC) 150 according to an example embodiment. As a semiconductor device, the SoC 150 may include an IC according to an example embodiment. The SoC 150 may be obtained by implementing complex blocks, such as intellectual properties (IPs), performing various functions in a single chip. The SoC 150 may be designed by a method of designing an IC, according to an example embodiment, and may thus have optimal performance and efficiency. Referring to FIG. 15, the SoC 150 may include a modem 152, a display controller 153, a memory 154, an external memory controller 155, a CPU 156, a transaction unit 157, a power management IC (PMIC) 158, and a GPU 159. The functional blocks of the SoC 150 may communicate with one another through a system bus 151.

The CPU 156 may control the operation of the SoC 150 at the top layer. The CPU 156 may control operations of the other functional blocks, i.e., the modem 152, the display controller 153, the memory 154, the external memory controller 155, the transaction unit 157, the PMIC 158, and the GPU 159. The modem 152 may demodulate a signal received from the outside of the SoC 150 or modulate a signal generated in the SoC 150 and transmit the generated signal to the outside. The external memory controller 155 may control data communication with an external memory device connected to the SoC 150. For example, a program and/or data may be provided from an external memory device to the CPU 156 or the GPU 159 under control by the external memory controller 155. The GPU 159 may execute program instructions related to graphics processing. The GPU 159 may receive graphics data through the external memory controller 155 and transmit graphics data, which has been processed by the GPU 159, to the outside of the SoC 150 through the external memory controller 155. The transaction unit 157 may monitor a data transaction of each functional block. Under control by the transaction unit 157, the PMIC 158 may control power supplied to each functional block. The display controller 153 may control a display (or a display device) outside the SoC 150 such that data generated in the SoC 150 may be transmitted to the display. The memory 154 may include non-volatile memory, such as electrically erasable programmable read-only memory (EEPROM) or flash memory, or volatile memory, such as dynamic random access memory (DRAM) or static RAM (SRAM).

Figure 16:
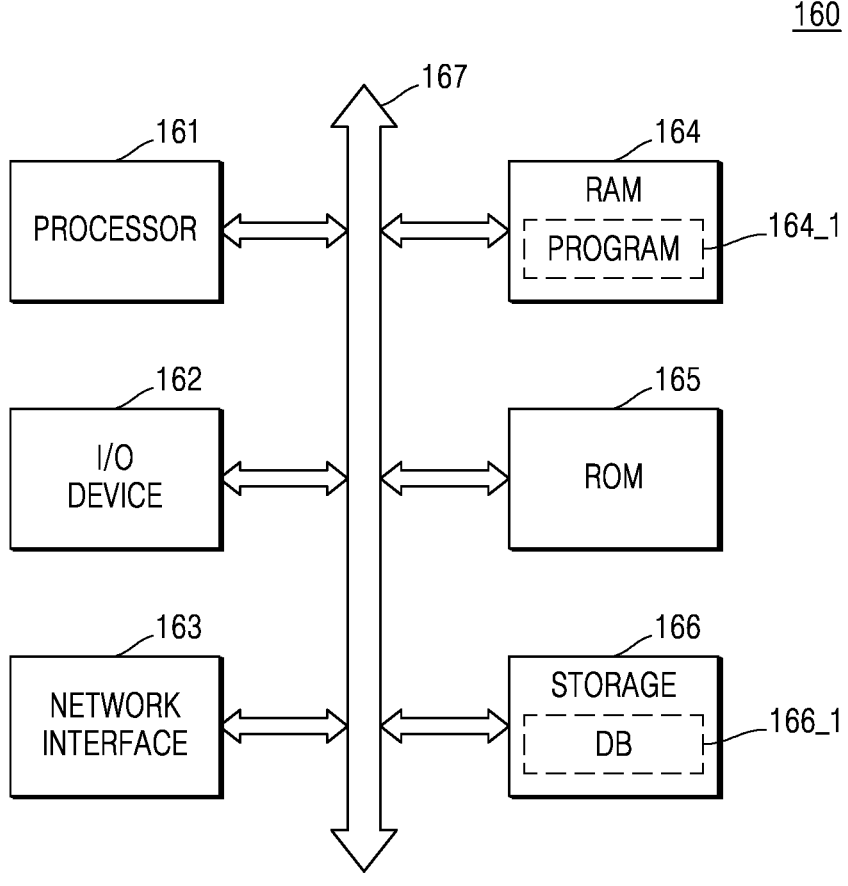
FIG. 16 is a block diagram of a computing system including a memory storing a program, according to an example embodiment.

FIG. 16 is a block diagram of a computing system 160 including a memory storing a program, according to an example embodiment. A method of designing an IC, e.g., at least some of the operations in the flowchart described above, according to example embodiments may be performed by the computing system (or a computer) 160. The computing system 160 may include a stationary computing system, such as a desktop computer, a workstation, or a server, or a mobile computing system, such as a laptop computer. As shown in FIG. 16, the computing system 160 may include a processor 161, input/output (I/O) devices 162, a network interface 163, RAM 164, ROM 165, and a storage 166. The processor 161, the I/O devices 162, the network interface 163, the RAM 164, the ROM 165, and the storage 166 may be connected to a bus 167 and communicate with one another through the bus 167.

The processor 161 may be referred to as a processing unit and may include at least one core, such as a microprocessor, an application processor (AP), a digital signal processor (DSP), or a GPU, which may execute an instruction set (e.g., Intel Architecture (IA)-32, 64-bit extension IA-32, x86-64, PowerPC, Sparc, MIPS, ARM, or IA-64). For example, the processor 161 may access memory, i.e., the RAM 164 or the ROM 165, through the bus 167 and execute instructions stored in the RAM 164 or the ROM 165.

The RAM 164 may store a program 164_1 for executing a method of designing an IC, according to an example embodiment, or at least part of the program 164_1. The program 164_1 may enable the processor 161 to perform at least some of the operations included in the method of designing an IC, e.g., the method of FIG. 14. In other words, the program 164_1 may include a plurality of instructions executable by the processor 161, and the instructions included in the program 164_1 may enable the processor 161 to perform at least some of the operations included in the flowchart described above.

The storage 166 may not lose data stored therein even when power supplied to the computing system 160 is cut off. For example, the storage 166 may include a non-volatile memory device or a storage medium, such as magnetic tape, an optical disk, or a magnetic disk. The storage 166 may be detachable from the computing system 160. The storage 166 may store the program 164_1, according to an example embodiment. Before the program 164_1 is executed by the processor 161, the program 164_1 or at least part of the program 164_1 may be loaded from the storage 166 to the RAM 164. Alternatively, the storage 166 may store a file written in a programming language. The program 164_1, which is generated from the file by a compiler or the like, or at least part of the program 164_1 may be loaded to the RAM 164. As shown in FIG. 16, the storage 166 may store a database (DB) 166_1. The DB 166_1 may include information necessary to design an IC, e.g., information about designed blocks, the cell library D12 in FIG. 14, and/or the design rules D14 in FIG. 14.

The storage 166 may store data to be processed by the processor 161 or data that has been processed by the processor 161. In other words, the processor 161 may generate data by processing data stored in the storage 166, according to the program 164_1, and store the generated data in the storage 166. For example, the storage 166 may store the RTL data D11, the netlist D13, and/or the layout data D15 in FIG. 14. The I/O devices 162 may include an input device, such as a keyboard or a pointing device, and an output device, such as a display device or a printer. For example, through the I/O devices 162, a user may trigger execution of the program 164_1 by the processor 161, input the RTL data D11 and/or the netlist D13 in FIG. 14, and check the layout data D15 in FIG. 14. The network interface 163 may provide access to a network outside the computing system 160. For example, the network may include a plurality of computing systems and communication links. The communication links may include wired links, optical links, wireless links, or other types of links.

While the inventive concept has been particularly shown and described with reference to embodiments thereof, it will be understood that various changes in form and details may be made therein without departing from the spirit and scope of the following claims.

What is claimed is:

1. An integrated circuit comprising:
a first transistor including a first gate extending in a first direction, a first drain, and a first source that is separated from the first drain in a second direction, which is perpendicular to the first direction;
a second transistor including a second gate extending in one of the first and second directions, a second drain, and a second source that is separated from the second drain in a third direction, which is perpendicular to the first and second directions; and
a first connection structure that electrically connects the first transistor to the second transistor, and includes a pattern extending in the second direction between the first transistor and the second transistor,
wherein the pattern overlaps with one of the first drain and the first source of the first transistor in the third direction and the pattern overlaps with the second gate of the second transistor in the third direction, and
wherein the first transistor corresponds to a lateral transistor and the second transistor corresponds to a vertical transistor.

2. The integrated circuit of claim 1, further comprising:
a first contact and a second contact electrically connected to the first transistor and the second transistor, respectively; and
a first via and a second via electrically connected to the first contact and the second contact, respectively; and
wherein the pattern includes a metal pattern connecting the first via to the second via.

3. The integrated circuit of claim 1, further comprising:
a first contact and a second contact connected to the first transistor and the second transistor, respectively; and
wherein the pattern includes a via connecting the first contact to the second contact.

4. The integrated circuit of claim 1, further comprising:
a first contact connected to the first transistor; and
wherein the pattern includes a second contact connecting the first contact to the second transistor.

5. The integrated circuit of claim 1, wherein the pattern extends from the second source in one of the first and second directions.

6. The integrated circuit of claim 1, further comprising:
a plurality of cells aligned in a plurality of rows extending in the second direction; and
wherein the first transistor, the second transistor, and the first connection structure are included within a first cell arranged in a first row of the plurality of rows among the plurality of cells.

7. The integrated circuit of claim 6,
wherein the plurality of cells include a second cell arranged in a second row adjacent to the first row; and
wherein the second cell includes:
a third transistor including a third gate extending in the first direction, a third drain, and a third source, which is separated from the third drain in the second direction;
a fourth transistor including a fourth gate extending in one of the first and second directions, a fourth drain, and a fourth source, which is separated from the fourth drain in the third direction; and
a second connection structure that electrically connects the third transistor to the fourth transistor, and includes a pattern extending in the second direction and between the third transistor and the fourth transistor.

8. The integrated circuit of claim 7, wherein the first transistor and the third transistor extend adjacent to a boundary between the first row and the second row.

9. The integrated circuit of claim 7, wherein the second transistor and the fourth transistor extend adjacent to a boundary between the first row and the second row.

10. The integrated circuit of claim 7, wherein a first width of the first row is greater than a second width of the second row; wherein the first transistor is larger than the third transistor;
and wherein the second transistor is larger than the fourth transistor.

11. The integrated circuit of claim 1, further comprising:
a plurality of cells aligned in a plurality of rows extending in the second direction;
wherein the plurality of cells include a first cell arranged in a first row of the plurality of rows and a second cell arranged in a second row adjacent to the first row;
wherein the first transistor is included in the first cell and the second transistor is included in the second cell; and
wherein the first connection structure includes a pattern crossing a boundary between the first row and the second row.

12. The integrated circuit of claim 11, wherein a first width of the first row is greater than a second width of the second row.

13. The integrated circuit of claim 1, further comprising:
a plurality of blocks;

wherein the first transistor is included in a first block among the plurality of blocks, and the second transistor is included in a second block among the plurality of blocks; and wherein the first connection structure is connected to the first block and the second block.

14. The integrated circuit of claim 1, further comprising:

at least one selected from a first power rail and a second power rail, with the first power rail being electrically connected to the first source and extending in one of the first and second directions, and the second power rail being electrically connected to the second source and extending in one of the first and second directions; and wherein each of the first and second power rails is one of a buried power rail (BPR) and a backside power rail (BSPR).

15. An integrated circuit, comprising:

a first transistor including a first gate extending in a first direction, a first drain, and a first source that is separated from the first drain in a second direction, which is perpendicular to the first direction;

a second transistor including a second gate extending in one of the first and second directions, a second drain, and a second source that is separated from the second drain in a third direction, which is perpendicular to the first and second directions; and a first connection structure that electrically connects the first transistor to the second transistor, said first connection structure including a first contact extending in the third direction between the first transistor and the second transistor, wherein the second source and the second drain overlap with one of the first source and the first drain in the third direction, and wherein the first transistor corresponds to a lateral transistor and the second transistor corresponds to a vertical transistor.

16. The integrated circuit of claim 15, wherein the first connection structure further includes a first pattern that extends in one of the first and second directions, and electrically connects the second gate and the first contact.

17. The integrated circuit of claim 15, wherein the first connection structure further includes a first pattern that is electrically connected to one of the second source and the second drain, and extends in one of the first and second directions.

18. The integrated circuit of claim 15, wherein the first connection structure electrically connects one of the first source and the first drain to one of the second source and the second drain.

19. An integrated circuit, comprising:

a first transistor including a first gate extending in a first direction, a first drain, and a first source that is separated from the first drain in a second direction, which is perpendicular to the first direction;

a second transistor including a second gate extending in one of the first and second directions, a second drain, and a second source that is separated from the second drain in a third direction, which is perpendicular to the first and second directions; and a first connection structure configured to electrically connect the first transistor to the second transistor, wherein the first transistor corresponds to a lateral transistor and the second transistor corresponds to a vertical transistor, and wherein the first gate of the first transistor and the second gate of the second transistor are electrically connected.

20. The integrated circuit of claim 15, wherein the first contact overlaps with the first transistor in the third direction.

* * * * *